United States Patent [19]

Bowers et al.

[11] Patent Number: 5,739,698

[45] Date of Patent: Apr. 14, 1998

[54] MACHINE FAULT DETECTION USING SLOT PASS FREQUENCY FLUX MEASUREMENTS

[75] Inventors: Stewart V. Bowers; Kenneth R. Piety, both of Knoxville, Tenn.

[73] Assignee: CSI Technology, Inc., Wilmington, Del.

[21] Appl. No.: 667,141

[22] Filed: Jun. 20, 1996

[51] Int. Cl.⁶ ............................................. G01R 31/02
[52] U.S. Cl. .............................. 324/772; 324/545
[58] Field of Search ............................ 324/772, 545, 324/546; 340/648; 318/798, 803, 806

[56] References Cited

U.S. PATENT DOCUMENTS

| | | | |
|---|---|---|---|
| 4,136,312 | 1/1979 | Salon et al. | 324/545 |
| 4,164,705 | 8/1979 | Whitney et al. | 324/772 |
| 4,377,784 | 3/1983 | Saito et al. | 324/772 |
| 4,441,065 | 4/1984 | Bayer et al. | 318/808 |
| 4,442,393 | 4/1984 | Abbondanti | 318/802 |
| 4,495,448 | 1/1985 | Dumbeck | 318/54 |
| 4,506,218 | 3/1985 | Brown et al. | 324/772 |
| 4,761,703 | 8/1988 | Kliman et al. | 361/23 |
| 4,808,932 | 2/1989 | Schulz, Jr. et al. | 324/545 |
| 4,940,932 | 7/1990 | Herrick et al. | 324/772 |
| 5,045,779 | 9/1991 | Herrick et al. | 324/772 |
| 5,049,815 | 9/1991 | Kliman | 324/772 |
| 5,252,915 | 10/1993 | Sedding et al. | 324/772 |
| 5,461,329 | 10/1995 | Linehan et al. | 324/772 |
| 5,519,337 | 5/1996 | Casada | 324/772 |
| 5,523,701 | 6/1996 | Smith et al. | 324/772 |
| 5,530,343 | 6/1996 | Bowers et al. | 324/173 |

OTHER PUBLICATIONS

S.V. Bowers and K.R. Piety, "Proactive Motor Monitoring Through Temperature, Shaft Current and Magnetic Flux Measurements," Computational Systems, Inc. User's Conference, Sep. 1994.

R.A. Leonard and W.T. Thomason, "Vibration and Stray Flux Monitoring for Unbalanced Supply and Inter–Turn Winding Fault Diagnosis in Induction Motors," British Journal of NDT, Jul. 1986, pp. 211–215.

M.S. Erlicki, Y. Porat, and A. Alexandrovitz, "Leakage Field Changes of an Induction Motor as Indication of Nonsymmetric Supply," vol. IGA–7, No. 6, Nov./Dec. 1971, pp. 713–717.

J. Penman, H.G. Sedding, B.A. Lloyd, and W.T. Fink, "Detection and Location of Interturn Short Circuits in the Stator Windings of Operating Motors," 94 WM 105–7 EC, 1994 IEEE, pp. 1–7. unknown month.

J. Penman, H.G. Sedding, B.A. Lloyd, W.T. Fink, R. Boggia, and B. Horowitz, "On–Line Detection and Location of Stator Winding Interturn Faults." unknown date.

S.V. Bowers, W.A. Davis, and K.R. Piety, "Proactive Motor Monitoring," Computational Systems, Inc. User's Conference, Sep. 1993.

(List continued on next page.)

*Primary Examiner*—Ernest F. Karlsen
*Assistant Examiner*—Anh Phung
*Attorney, Agent, or Firm*—Luedeka, Neely & Graham, P.C.

[57] ABSTRACT

A method for nonintrusive detection of anomalies in electric machines. A flux coil is positioned external to the motor to obtain magnetic leakage flux measurements, which are transformed to the frequency domain to obtain a flux spectrum. Asymmetry-producing faults, such as turn-to-turn stator winding shorts, produce changes in the amplitudes of individual frequencies and groups of frequencies within a defined slot pass family of frequencies of the flux spectrum. The measured amplitudes of the slot pass family of frequencies are compared to reference and trend data. Significant changes in the slot pass frequency amplitudes indicate the presence of a machine fault or other anomalous condition. Significant changes are determined by comparing individual amplitudes and groups of amplitudes of the slot pass family of frequencies to an absolute or delta threshold value. Alternatively, measured amplitudes of the slot pass frequencies can be statistically compared to trend data previously acquired for the motor to determine when a significant change in the slot pass amplitudes has occurred.

37 Claims, 14 Drawing Sheets

OTHER PUBLICATIONS

NEMA Standards Publication No. MG 1, Tests and Performance—AC, NEMA MG 1-1987, Part 12, pp. 10-12.

J. Penman and M.N. Dey, "Multi-Functional Monitoring and Protection Scheme for Electrical Machines," UPEC 19 Universities of Dundee and Aberdeen, U.K. unknown date.

L.D. Berry, "How to Link Thermal and Vibration Data to Diagnose Mechanical Power Transmission Problems," P/PM Technology, Apr. 1993, pp. 12-14.

W.T. Thomson, R.A. Leonard, A.J. Milne, and J. Penman, "Failure Identification of Offshore Induction Motor Systems Using On-Condition Monitoring," Proceedings of 4th National Reliability Conference, Birmingham, U.K., 1983 unknown month.

J. Penman, M.N. Dey, A.J. Tait, and W.E. Bryan, "Condition Monitoring of Electrical drives," IEE Proceedings, vol. 1133, Part B, No. 3, May 1986.

| FREQUENCY (Hz) VALUE | DESCRIPTION | | AMPLITUDE (dB) REFERENCE | COMPARISON | DIFFERENCE (COMP-REF) (dB) | RMS RATIO COMP / REF |
|---|---|---|---|---|---|---|
| 70.3 | PSP- | 2xLF +RPS | -30.69 | -31.78 | -1.09 | .88 |
| 160.9 | PSP- | 0xLF | -26.49 | -27.19 | -.70 | .92 |
| 280.9 | PSP- | 8xLF | -16.47 | -20.11 | -3.64 | .66 |
| 310.2 | PSP- | 8xLF +RPS | -30.78 | -34.29 | -3.51 | .67 |
| 371.5 | PSP- | 6xLF -RPS | -28.98 | -31.78 | -2.81 | .72 |
| 400.8 | PSP- | 6xLF | -10.45 | -20.23 | -9.78 | .32 |
| 520.8 | PSP- | 4xLF | -32.92 | -12.64 | 20.29 | 10.34 |
| 611.4 | PSP- | 2xLF -RPS | -30.80 | -31.78 | -.98 | .89 |
| 640.7 | PSP- | 2xLF | -14.76 | -22.04 | -7.27 | .43 |
| 670.0 | PSP- | 2xLF +RPS | -21.64 | -26.20 | -4.56 | .59 |
| 731.3 | PSP+ | 0xLF -RPS | -32.20 | -19.91 | 12.29 | 4.12 |
| 760.6 | PSP+ | 0xLF | -3.85 | -.31 | 3.54 | 1.50 |
| 789.9 | PSP+ | 0xLF +RPS | -39.78 | -19.83 | 19.95 | 9.94 |
| 851.4 | PSP+ | 2xLF -RPS | -23.48 | -25.09 | -1.61 | .83 |
| 880.6 | PSP+ | 2xLF | -12.53 | 10.38 | 22.92 | 13.99 |
| 909.9 | PSP+ | 2xLF +RPS | -29.07 | -16.92 | 12.15 | 4.05 |
| 971.2 | PSP+ | 4xLF -RPS | -22.35 | -18.47 | 3.88 | 1.56 |
| 1000.5 | PSP+ | 4xLF | 7.31 | 5.27 | -2.05 | .79 |
| 1029.9 | PSP+ | 4xLF +RPS | -15.86 | -18.84 | -2.98 | .71 |
| 1091.1 | PSP+ | 6xLF -RPS | -25.17 | -26.42 | -1.25 | .87 |
| 1120.5 | PSP+ | 6xLF | -1.70 | -7.29 | -5.59 | .53 |
| 1240.4 | PSP+ | 8xLF | -23.99 | -17.05 | 6.94 | 2.22 |
| 1360.3 | PSP+ | 0xLF | -36.87 | -27.17 | 9.69 | 3.05 |

| SLOT PASS FAMILY | COMPARISON-REFERENCE + ENERGY | - ENERGY | NORMALIZED COMP-REF POSITIVE | NEGATIVE |
|---|---|---|---|---|
| 2xLF FAMILY | 3.095 | .666 | 1.1919 | .2567 |
| RPS SIDEBANDS | .166 | .061 | .0640 | .0235 |

REF. SLOT PASS ENERGY SUM = 2.60 (RMS)

Fig. 10

| DATE | TIME | VALUE | | DATE | TIME | VALUE |
|---|---|---|---|---|---|---|
| 15-MAR-94 | 22:17 | .0111 | | 16-MAR-94 | 16:23 | 4.8874 |
| 15-MAR-94 | 22:39 | .0624 | | 17-MAR-94 | 12:01 | 1.1915 |
| 15-MAR-94 | 22:56 | .1177 | | 17-MAR-94 | 12:06 | 1.1959 |
| 15-MAR-94 | 23:13 | .1624 | | 17-MAR-94 | 12:10 | 1.1752 |
| 16-MAR-94 | 07:55 | .0192 | | 17-MAR-94 | 12:16 | 1.2173 |
| 16-MAR-94 | 08:09 | .0068 | | 17-MAR-94 | 12:29 | 1.2241 |
| 16-MAR-94 | 08:22 | .0169 | | 17-MAR-94 | 12:33 | 1.1944 |
| 16-MAR-94 | 08:33 | .0282 | | 17-MAR-94 | 12:39 | 1.1919 |
| 16-MAR-94 | 08:47 | .0000 | | 17-MAR-94 | 12:45 | 1.1943 |
| 16-MAR-94 | 08:58 | .0348 | | 17-MAR-94 | 12:51 | 1.2603 |
| 16-MAR-94 | 09:10 | .0591 | | 17-MAR-94 | 12:55 | 1.2578 |
| 16-MAR-94 | 09:23 | .1077 | | 17-MAR-94 | 13:00 | 1.2139 |
| 16-MAR-94 | 10:48 | .6320 | | 17-MAR-94 | 13:05 | 1.1976 |
| 16-MAR-94 | 11:02 | .8617 | | 17-MAR-94 | 13:22 | 1.1936 |
| 16-MAR-94 | 11:21 | .8670 | | 17-MAR-94 | 13:32 | 1.1774 |
| 16-MAR-94 | 11:31 | .8734 | | 17-MAR-94 | 13:48 | 1.1965 |
| 16-MAR-94 | 15:49 | 2.2770 | | 17-MAR-94 | 13:52 | 1.1834 |
| 16-MAR-94 | 16:01 | 2.5044 | | 17-MAR-94 | 14:07 | 1.3768 |
| 16-MAR-94 | 16:16 | 3.4299 | | 17-MAR-94 | 14:11 | .0100 |

Fig. 12

| DATE | TIME | VALUE | | DATE | TIME | VALUE |
|---|---|---|---|---|---|---|
| 15-MAR-94 | 22:17 | .0029 | | 16-MAR-94 | 16:23 | .1979 |
| 15-MAR-94 | 22:39 | .0032 | | 17-MAR-94 | 12:01 | .0690 |
| 15-MAR-94 | 22:56 | .0047 | | 17-MAR-94 | 12:06 | .0658 |
| 15-MAR-94 | 23:13 | .0057 | | 17-MAR-94 | 12:10 | .0656 |
| 16-MAR-94 | 07:55 | .0040 | | 17-MAR-94 | 12:16 | .0651 |
| 16-MAR-94 | 08:09 | .0052 | | 17-MAR-94 | 12:29 | .0679 |
| 16-MAR-94 | 08:22 | .0311 | | 17-MAR-94 | 12:33 | .0671 |
| 16-MAR-94 | 08:33 | .0078 | | 17-MAR-94 | 12:39 | .0640 |
| 16-MAR-94 | 08:47 | .0000 | | 17-MAR-94 | 12:45 | .0674 |
| 16-MAR-94 | 08:58 | .0069 | | 17-MAR-94 | 12:51 | .0693 |
| 16-MAR-94 | 09:10 | .0129 | | 17-MAR-94 | 12:55 | .0618 |
| 16-MAR-94 | 09:23 | .0259 | | 17-MAR-94 | 13:00 | .0660 |
| 16-MAR-94 | 10:48 | .0561 | | 17-MAR-94 | 13:05 | .0655 |
| 16-MAR-94 | 11:02 | .0716 | | 17-MAR-94 | 13:22 | .0640 |
| 16-MAR-94 | 11:21 | .0679 | | 17-MAR-94 | 13:32 | .0647 |
| 16-MAR-94 | 11:31 | .2518 | | 17-MAR-94 | 13:48 | .0599 |
| 16-MAR-94 | 15:49 | .0989 | | 17-MAR-94 | 13:52 | .0657 |
| 16-MAR-94 | 16:01 | .0970 | | 17-MAR-94 | 14:07 | .0695 |
| 16-MAR-94 | 16:16 | .1742 | | 17-MAR-94 | 14:11 | .0174 |

Fig. 14

MACHINE FAULT DETECTION USING SLOT PASS FREQUENCY FLUX MEASUREMENTS

TECHNICAL FIELD

The present invention relates to nonintrusive on-line detection of faults in electric machines having a stator and a rotor. More particularly, it relates to a method of detecting faults in electric machines by using slot pass frequency flux measurements.

BACKGROUND OF THE INVENTION

Electric machines, including electric motors and generators, are at the heart of the production process for many industries. Proper maintenance of these machines is critical to the efficient and profitable operation of these industries. Complicating the detection of electric machine faults is the fact that many faults are subtle and somewhat insidious to the overall operation of the machine. Such faults are not readily observable and require unique fault detection and monitoring approaches to prevent the fault from escalating into a possibly catastrophic machine failure. Preferably, fault detection and monitoring will be nonintrusive and on-line (i.e., while the motor is operating) so as to not interfere with the normal operation of the machine. In this manner, fault monitoring will enhance maintainability while reducing downtime.

There are a variety of approaches to detecting faults occurring in the rotor of a machine during operation. A typical approach to rotor fault detection in an induction motor is described by Kliman et al. in U.S. Pat. No. 4,761,703. All electric machines having a stator and a rotor produce axial leakage flux as a result of asymmetries caused by manufacturing imperfections in the machine. Kliman describes the use of a flux sensor to generate flux signals corresponding to the magnetic flux at a predefined flux detection point external to the motor. Kliman also uses a current sensor to generate a signal proportional to the current being drawn by the motor. A stored time series of the flux and current signals are then transformed into the frequency domain by means of a fast Fourier transformation, producing a flux spectrum and a current spectrum. The frequencies of concern for this analysis include line frequency (LF) and harmonics of LF (does not look at slot pass). Line frequency and slip frequency are determined, and the amplitudes of the current spectrum are compared at a set of rotor fault harmonic frequencies (all related to LF) with specified fault threshold criteria. A rotor fault is denoted if the amplitude of a predefined set of the current spectra exceed the corresponding fault threshold criteria.

The rotor fault detection method described in Kliman, as well other approaches to detecting rotor faults, are assumed to work well, but rotor faults represent a relatively small percent of failures that occur in electric machines, particularly large electric induction motors. Statistical failure rate data shows that only about 9% of all electric induction motor failures are the result of rotor faults, while stator faults represent 36% of the failures. The remaining failures are the result of such things as bearing faults, foreign object contamination, etc. Therefore, a reliable method of nonintrusive, on-line stator fault detection would provide at least a three-fold improvement in maintainability over even the best method of rotor fault detection.

Presently, there is only one known technique that purportedly is capable of detecting faults associated with the electrical insulation of induction motor stators while the machine is in operation. Sedding et al. in U.S. Pat. No. 5,252,915 purports to describe a method and apparatus for detecting stator faults in rotary dynamoelectric machines. The approach taken in Sedding focuses on the use of four search coils spaced symmetrically around the axis of the motor to collect flux signals. Selected frequencies (or harmonics) are evaluated from a summation of the four flux sensors. These selected frequencies are "related" to the line frequency peak and its harmonics. Changes in these selected frequencies can indicate inter-turn faults. Algebraic expressions are used to calculate the angular position of the fault by comparing the overall flux value from each of the four flux coils. These algebraic expressions require a knowledge of the number of poles and the rotational speed of the machine.

A recurring theme in the prior art methods of detecting rotor faults, as well as the Sedding method of detecting stator faults, is that these methods generally focus on low frequency components related to line frequency and harmonics of line frequency. More specifically, the prior art avoids analysis of higher frequency components, including the slot pass family of frequencies (which are not harmonics of line frequency), as a method for detecting stator faults.

SUMMARY OF THE INVENTION

Regarding the foregoing, the present invention provides a method of detecting electrical anomalies in an electric machine having a stator and a rotor and producing leakage flux during operation of the motor. One embodiment of this method involves producing a time series of measured flux signals containing slot pass family frequencies and associated amplitudes. The measured flux signals, which are produced with a flux measurement sensor, are representative of the leakage flux produced by the machine. The time series of measured flux signals is transformed into a measured spectrum representative of the slot pass family frequencies and associated amplitudes of the measured flux signals. One or more prior spectra representing leakage flux characteristics produced by a healthy machine are provided. At least one measured parameter is determined from the measured spectrum, and at least one prior parameter corresponding to the at least one measured parameter is determined from the prior spectra. Measured parameters are compared to prior parameters, and the presence of an electrical anomaly is determined when at least one measured parameter differs from one or more corresponding prior parameters by a threshold amount.

Prior parameters may be in the form of an amplitude of a single frequency within the slot pass family of frequencies of the prior spectra. Alternatively, a subset of amplitudes are summed or otherwise arithmetically combined to produce a prior parameter, which is compared to the summed amplitudes of a corresponding subset of the measured spectrum. An electrical anomaly is found to exist if one or more parameters of the measured spectrum differ from corresponding parameters of the prior spectra by a threshold amount. The threshold amount can be either an absolute value or a delta change in the measured parameter over a prior parameter.

In a further embodiment of the present invention, the threshold amount is determined by statistical analysis of trend parameters. For example, if measured parameters differ from trend parameters by three standard deviations from the mean value of the trend parameters, a machine fault condition is known to exist. However, to perform this statistical analysis of the measured data at least three data points (prior spectra) must have been previously acquired.

In another embodiment of the present invention, there is provided a method of detecting faults in an AC electric motor having a stator and a rotor. The method includes the step of generating a first time series of flux signals with a flux measurement sensor at a first time while the motor is operating in good condition. The first time series of flux signals contains slot pass family frequencies and associated amplitudes representative of the leakage flux produced by the motor. The first time series of flux signals is transformed into a first spectrum which is stored. The first spectrum is representative of the slot pass family frequencies and associated amplitudes of the first time series of flux signals. Second and third time series of flux signals are generated at times that are later than when the first time series of flux signals were generated. These second and third time series of flux signals are also transformed into second and third spectra. A fourth time series of flux signals is generated at a time later than when the first, second, and third time series of flux signals were generated, and transformed into a fourth spectrum. Parameters of the first, second, and third spectra (collectively the prior spectra) are compared at the slot pass family frequencies with corresponding parameters of the fourth spectrum and if one or more parameters of the fourth spectrum differ from corresponding parameters of the prior spectra by a threshold amount as determined by three standard deviations from the mean value of the prior spectra, a fault condition is determined to exist.

To ensure consistent and reliable analysis results, each time series of flux signals is generated by a substantially identical flux measurement sensor (preferably the same sensor each time) that is consistently placed in the same location and orientation to the motor.

Another method of detecting faults in an AC electric motor involves producing first, second, and third spectra as previously described. A reference spectrum is also provided which is representative of the slot pass family frequencies and associated amplitudes of leakage flux produced by the electric motor when no electrical anomalies exist. One or more parameters are calculated from corresponding amplitudes of the reference spectrum and each of the first, second, and third spectra. The one or more parameters of the first, second, and third spectra are collectively referred to as trend data. A comparison spectrum is produced from a time series of flux signals that are generated at a time later than when the first, second, and third time series of flux signals were generated. Comparison parameters are calculated from corresponding amplitudes of the comparison and reference spectra and compared to the trend data. A fault is determined to exist if one or more of the comparison parameters exceed corresponding ones of the trend data by a threshold amount. For example, a fault exists if a comparison parameter exceeds corresponding parameters of the trend data by three standard deviations from the mean value of the trend data parameters.

BRIEF DESCRIPTION OF THE DRAWINGS

The present invention may best be understood by reference to the Detailed Description of the Preferred Embodiment with reference to the drawings wherein like reference characters designate like or similar elements throughout the several drawings as follows:

FIG. 10 is a table listing flux measurement data for a faulted motor, including the motor's slot pass family of frequencies, reference spectral data, comparison (measured) spectral data, and various comparisons thereof;

FIG. 12 is a table which lists, in chronological order, the individual parameter measurements comprising the plot of FIG. 11;

FIG. 14 is a table which lists, in chronological order, the individual parameter measurements comprising the plot of FIG. 13.

DETAILED DESCRIPTION OF THE PREFERRED EMBODIMENT

Figure 1:
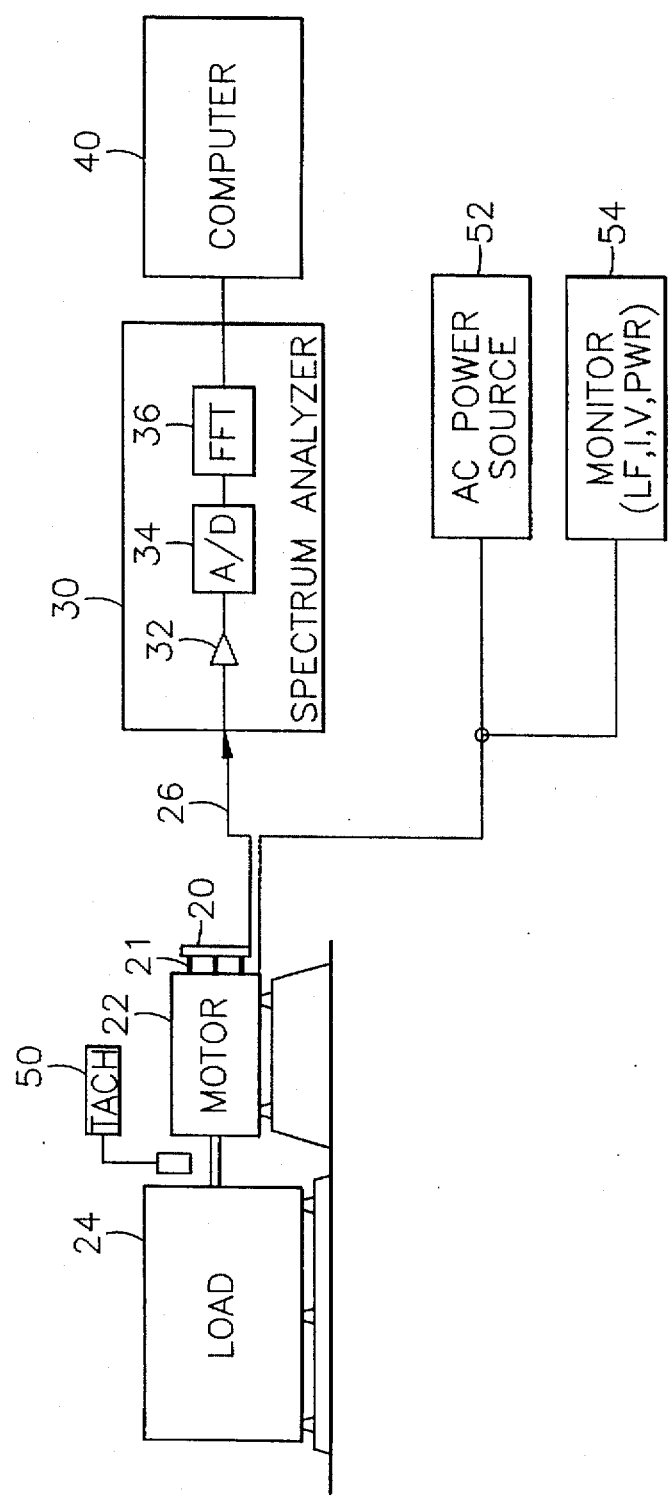
FIG. 1 is a somewhat diagrammatic illustration of an electric induction motor being monitored for faults by use of the present invention.

Electrical characteristics within an electric machine having a stator and a rotor change as a result of asymmetries in the stator windings. These asymmetries present themselves as axial magnetic leakage flux that is detectable by using a flux coil placed external to the machine in the magnetic leakage flux field. In this manner, the magnetic leakage flux resulting from asymmetries in the machine is detectable without any interruption or intrusion of the machine's operation. A time series of flux coil signals can be analyzed in the frequency domain to yield a series of slot pass frequencies and associated sideband frequencies of varying amplitude.

Stator winding faults are not the only producers of magnetic leakage flux. Rotor faults, voltage imbalance, and airgap eccentricity can also effect leakage flux. Additionally, asymmetries are inherent to even healthy machines due to manufacturing imperfections that prevent precise cancellation of stator and rotor currents. Each individual machine will generally produce its own leakage flux spectral peaks, or amplitudes since manufacturing defects do not duplicate themselves exactly. In other words, each healthy machine will produce its own distinct leakage flux spectrum with its own distinct set of amplitudes. Although the amplitudes will vary between machines of like design and construction, the frequencies themselves will generally vary little, being primarily determined not by manufacturing imperfections like their corresponding amplitudes, but rather, by their specific machine parameters such as the number of rotor bars, the number of stator slots, running speed, and line frequency. Additionally, the amplitudes of certain frequencies will change significantly when a stator fault or other anomalous condition occurs. Such faults are detectable by observing and analyzing changes in the amplitudes of certain frequencies.

It has been determined that the most basic stator fault—a short between two windings (turn-to-turn short)—can be detected by analyzing, in the frequency domain, the amplitudes of the machine's slot pass family of frequencies. The principle "slot pass" frequency (PSP) of a machine occurs at either the product of the number of rotor bars and running speed minus line frequency, as given by the following equation:

$$PSP_r = (\#RB \times RPS) - LF \quad (1)$$

where:
RB represents number of rotor bars,
RPS represents running speed in revolutions per second, and
LF represents line frequency (Hz),
or at the product of the number of stator slots and running speed minus line frequency, as given by the following equation:

$$PSP_s = (\#SS \times RPS) - LF \quad (2)$$

where:
SS represents the number of stator slots.
A subset of the "slot pass family" of frequencies occurs at the principle slot pass frequency $\pm n \times LF$, where n=0, 2, 4 . . . . This particular family of frequencies will be termed the "2×LF" subset of the slot pass family of frequencies.

Modulating about each of the 2×LF subset frequencies will be multiples of running speed sidebands and multiples of slip frequency sidebands. Line frequency sidebands have also been observed modulating about the 2×LF subset of frequencies. These sideband frequencies are collectively termed the "subset of slot pass sideband frequencies". The combination of the 2×LF subset, the multiples of running speed and slip frequency sidebands, as well as the line frequency sidebands, and all amplitudes thereof, are collectively termed the "slot pass family of frequencies".

Running speed and slip frequency of an electric machine are determined either mathematically or by direct measurement. Line frequency is determined by direct measurement. For example, an AC motor internally employs a given number of magnetic poles, organized as pole pairs. The motor synchronous speed (RPS$_s$) (maximum unloaded speed) is equal to the AC line frequency (LF) divided by the number of pole pairs (PP), as given by the following equation:

$$RPS_s = LF/PP \quad (3)$$

Thus, the synchronous speed of a two-pole motor (one pole pair), having a line frequency of 60 Hz for example, is 60 revolutions per second, or 3600 revolutions per minute. The synchronous speed of a four-pole motor for example is 30 revolutions per second or 1800 revolutions per minute.

The actual running speed of a motor under load is less than the synchronous speed, and the difference between synchronous speed (RPS$_s$) and running speed under load (RPS$_L$) is known as the slip frequency (SF), given by the following equation:

$$SF = RPS_s - RPS_L \quad (4)$$

It has been discovered that any harmonic amplitude within the slot pass family of frequencies is potentially capable of indicating a turn-to-turn short or any other electrical asymmetry in the stator, so a knowledge of the exact number of rotor bars or stator slots for purposes of calculating frequencies of interest is not necessary. Two suitable methods of identifying the slot pass family of peaks are, for example: First, using the machine's running speed, line frequency, and the number of rotor bars or stator slots, the principal slot pass frequency (PSP) is determined using either equation (1) or (2). Rated running speed at 100% load is usually placarded onto the machine, line frequency is usually known or can be measured, and the number of rotor bars in large, electric machines is generally known to vary between about 30 and 200. With this knowledge, one can find the PSP frequency and its associated family of slot pass peaks without knowing the precise number of rotor bars or stator slots by observing the frequency spectrum in the vicinity of where the family is expected to be based on an estimate of the number of rotor bars or stator slots, the running speed, and the line frequency. A pronounced family of peaks in the aforementioned vicinity will be the slot pass family of frequencies. Second, the slot pass family of frequencies is itself discernable in the flux spectrum. To find the slot pass family of frequencies, one need only look in the high frequency range from about 400 Hz to about 6,000 Hz. The slot pass family of frequencies will have prominent 2×LF separation and will not be a multiple of line frequency.

Changes in the amplitudes of the slot pass family of frequencies can be analyzed by comparison to alarm values to determine when a fault exists. FIG. 1 illustrates a preferred apparatus and method of detecting a fault, such as a stator winding fault, of an electric motor 22 drawing power from an AC power source 52. For measuring running speed of the motor 22, a standard tachometer 50 can be used. The line frequency of the power source 52, as well as the supplied current, voltage, and power can all be measured by means of a multimeter 54 or other standard power source monitor(s). To measure the magnetic leakage flux generated by the motor 22, a flux coil 20 is mounted axially to one end of the electric motor 22 while the motor 22 is operating to drive a load 24. The flux coil 20 is made of wire wound into a coil of circular dimension. Generally, 100 to 200 turns are sufficient. A typical flux coil 20 has a diameter of eight inches, but may be varied based on the size of the motor.

Although the preferred location for attachment is the outboard end of the motor 22, the coil 20 may be placed at any point on the motor 22 where leakage flux can be detected. Leakage flux is measured by the coil 20 which produces a flux signal in the form of an electrical current on line 26, the amplitude of which depends on the total number of turns used to make the coil since the more turns the flux coil 20 has, the larger the current signal that it will produce. The current signal on line 26 is received by a spectrum analyzer 30, such as a CSI 2115 or 2120 analyzer, and converted to an analog voltage by measuring the voltage across an input impedance (not shown) that receives the current signal. The analog voltage is amplified by amplifier 32 and converted from analog to digital by A/D converter 34.

A time series of digitized flux signals are collected and then transformed to the frequency domain by means of a fast Fourier transform 36 (FFT). Although a single frequency domain spectrum of the measured flux signal 26 will suffice, the spectral data is enhanced by obtaining a number of spectra and averaging them to produce a single spectrum.

Fault detection may be accomplished by a variety of analysis methods. In a preferred method, analysis is accomplished by comparing a measured leakage flux spectrum with one or more previously measured and recorded spectra to determine when significant changes occur in the amplitudes of subsets of frequencies (which may include a single frequency) within the slot pass family of frequencies. These subsets are used to create parameters that are compared with absolute parametric values or with delta or statistical variances from corresponding parameters of one or more previously measured spectra to determine if a fault exists. Statistical thresholds or alarm limits are set for observed changes in the parameters based on standard deviations from the mean values of previously measured parameters. Anything more than three standard deviations from the mean indicates a likely fault condition. For non-statistical analyses, thresholds are set as absolute values and as delta changes above or below the previously measured parameter values.

The parameters discussed above may be created by summing or otherwise arithmetically combining the amplitudes of certain frequencies or subsets of frequencies within the slot pass family of frequencies for each of the measured leakage flux spectra (reference and comparison spectra). For example, a parameter may be created by first subtracting all slot pass amplitudes of a previously measured spectrum (reference spectrum) from corresponding amplitudes of the measured (comparison) spectrum to produce difference values. The difference values represent + energy values for all values where the comparison amplitude is larger than its corresponding reference amplitude, and − energy values for all values for each comparison amplitude that is smaller than its corresponding reference amplitude. From these difference values, a + energy parameter is calculated by squaring all + energy values, summing the squared + energy values, and then taking the square root of the sum. Likewise, a − energy parameter is calculated by squaring, summing, and taking the square root of all − energy values. Again, a three standard deviation from the mean, absolute value, and delta change are used to determine parameter thresholds for purposes of setting alarms.

Once the spectrum analyzer 30 has received, transformed, and stored the measured spectra, the measured data is downloaded to a base computer 40. The computer 40 receives the measured spectrum from the spectrum analyzer 30 and analyzes it by comparing various parameters of the measured spectrum with corresponding parameters of one or more flux spectra that have been previously acquired from the motor 22. For example, if the amplitudes of one or more of the slot pass family of frequencies of the measured spectrum differ from the same parameters of previously acquired spectra by more than three standard deviations from the mean value of the previously acquired spectral parameters, then a fault is likely. At least two previously acquired flux spectra are needed as trend data in order to perform a three standard deviation statistical calculation. For statistical analysis of some parameters, such as the + energy and − energy parameters described above, a minimum of four spectra are required. More specifically, a reference spectrum and two previously acquired comparison spectra are needed to produce two previously acquired + energy or − energy parameters (trend data). These trend data are then used for statistical analysis with a comparison spectrum (fourth spectra) to determine if a fault condition exists. If insufficient trend data is available from previous measurements for statistical comparison to the measured data, another analysis method should be employed.

Other analysis methods include comparison of parameters of the measured spectrum to corresponding parameters of a "healthy machine", or reference spectrum. Ideally, the healthy machine, or reference spectrum of the motor 22 will have been measured and stored in the computer 40 when the motor 22 was known to have been healthy, such as when the motor 22 was first installed, or perhaps immediately after it was repaired from a prior malfunction. This reference spectrum is also included in the trend data to be used in statistical methods employed to detect faults in the motor 22. Each measurement of the flux spectrum can be stored in the computer 40 as trend data to be statistically analyzed with future measurements of the flux spectrum. If a reference spectrum is unavailable, one may be determined or estimated in a variety of ways, such as from knowledge of typical flux spectra taken from healthy machines of similar design and construction. If the measured spectrum differs from the estimated reference by a threshold amount, which threshold may be either a delta change or an absolute amount, a fault condition is likely.

As discussed above, spectra produced by the spectrum analyzer 30 are evaluated after each measurement for significant changes from prior measurements by using repeatable and reliable test procedures and equipment. Consistency in the data collection and analysis process is an important factor in maintaining accurate analysis results. For example, inconsistent placement of the flux coil 20 from one measurement to the next could result in frequency amplitudes that vary, even though no anomalous conditions exist. It is important that flux measurements be taken at the same location, with the same spacing between the flux coil 20 and motor 22, and without swinging or twisting movement of the flux coil 20. To improve consistent placement of the flux coil 20 on a particular machine 22, the flux coil 20 is preferably secured to the outboard end of the motor 22 by magnets 21 or other mounting device preferably in a centered axial position, which position is clearly marked for repeatability. If the axial center position is not accessible, then an off-center, axial position will be acceptable as long as consistent placement of the flux coil 20 is maintained from measurement to measurement.

Another potential source of inconsistency that could affect the reliability of the analysis process is the shape of the flux coil 20 itself. When wire is wrapped to form a coil, the resulting flux coil is fairly flexible, and has the apparent advantage that the coil can be shaped to fit in and around many odd-shaped spaces. Even though subsequent measurements may be taken at the same location on a motor 22, significant differences in the flux coil 20 shape from one measurement to the next can cause changes in frequency amplitudes. This also limits the reliability of trend data and could result in false alarms. Therefore, a rigidly formed flux coil 20 that is resistant to geometric variations should be used.

Testing conducted to date on a variety of induction motor has established a normal variation in amplitude of less than 10 dB for each peak within the slot pass family of frequencies. In other words, testing has shown that an induction motor 22 will experience normal amplitude variations within the slot pass family of frequencies, resulting from normal load changes or other non-fault conditions, of not more than 10 dB per frequency. Additionally, testing has shown that when a fault does occur, it is usually accompanied by a 10 dB or greater change in amplitude for at least one of the slot pass family frequencies. Thus, for induction motors at least, anything more than a 10 dB variation in the amplitude of a slot pass family frequency indicates the presence of a fault.

The following test results are presented as examples to help illustrate how significant changes in slot pass family parameters are indicative of the presence of a stator fault or other electrical anomaly.

EXAMPLE 1

An induction motor having 28 rotor bars and running at approximately 83% of full load was evaluated with the stator in good condition (no fault) and with shorted stator windings producing a turn-to-turn short (faulted condition). The line frequency supplying the motor was measured at 59.97 Hz. The speed of the motor in the good and faulted conditions was 29.32 Hz and 29.31 Hz respectively. With a knowledge of these parameters, the principle slot pass frequency (PSP) was calculated from equation (1) to be 760.99 Hz for the stator in good condition and 760.71 Hz for the stator in the faulted condition. The measured flux spectra for this motor are plotted in FIGS. 2 and 3 for the good and faulted conditions respectively.

Figure 2:
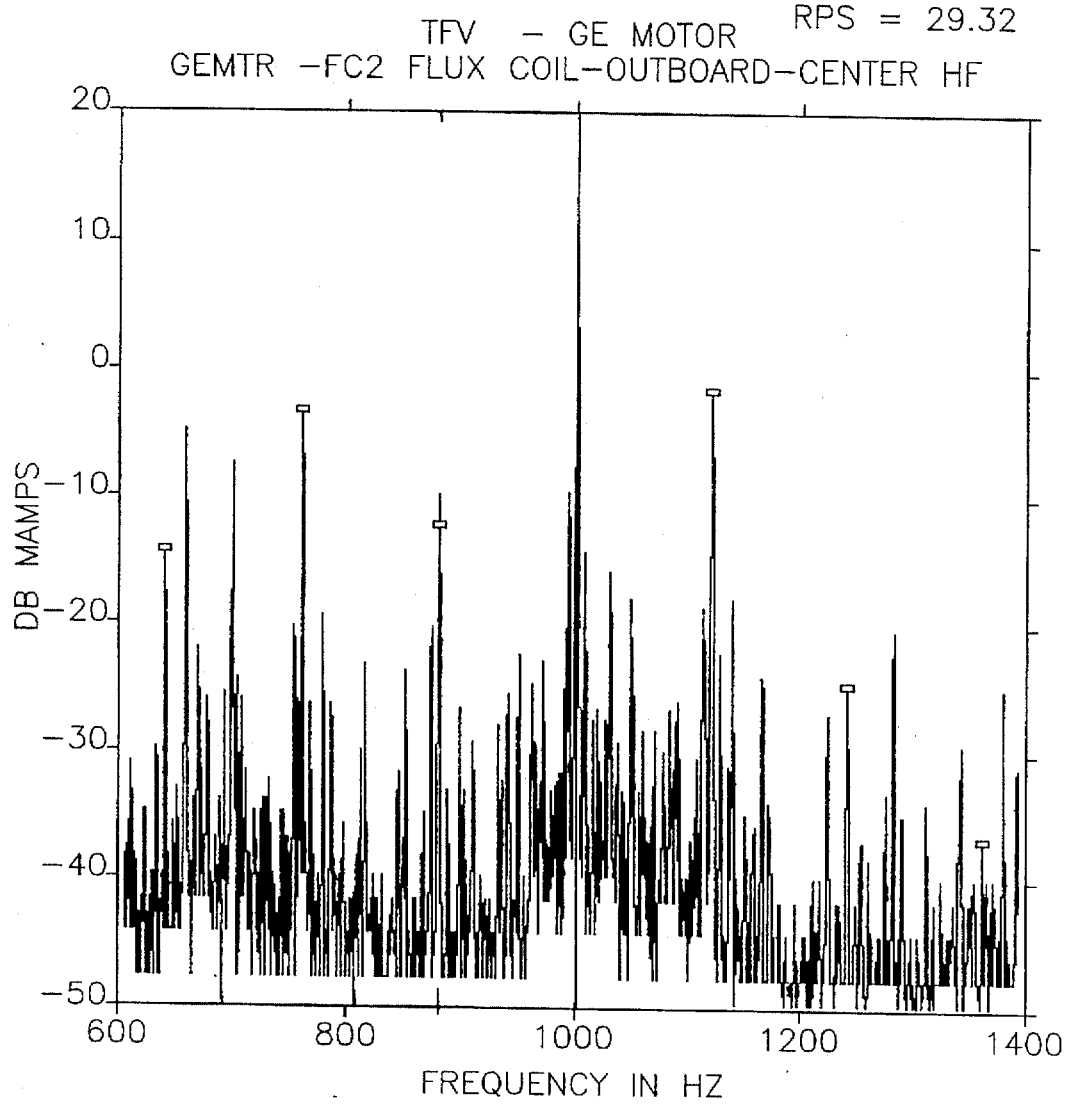
FIG. 2 is a leakage flux spectrum plot showing the slot pass family of peaks for an electric induction motor in good condition.
Figure 3:
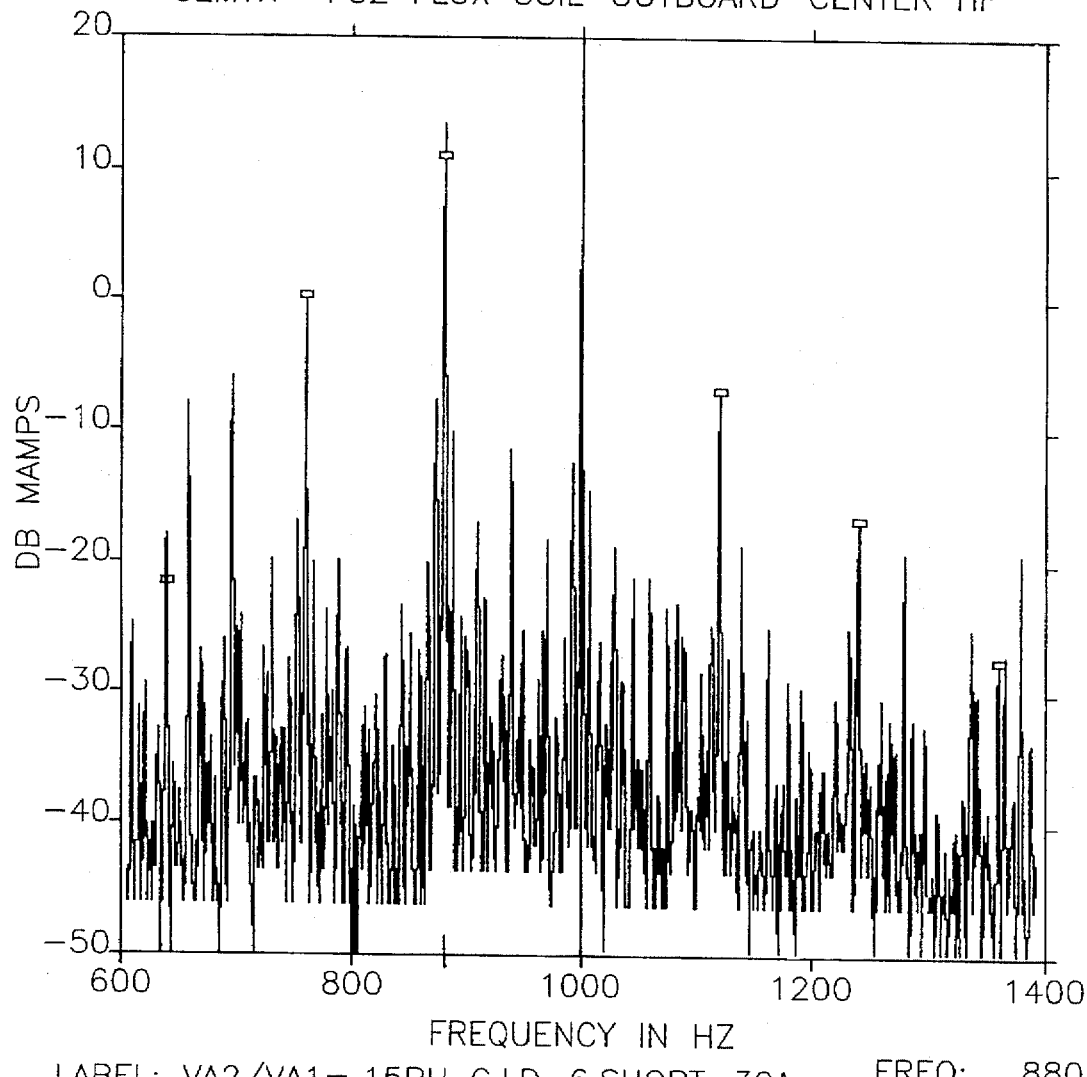
FIG. 3 is a leakage flux spectrum plot showing the slot pass family of peaks for an electric induction motor having a stator fault.

Listed in Table 1 are the amplitudes for a subset of the slot pass family of frequencies (the 2×LF family) plotted in FIGS. 2 and 3. Differences shown in Table 1 between the amplitudes for some of the 2×LF family of slot pass frequencies in the good and faulted motor conditions are compared to determine if a fault exists. An alarm is signaled when the statistical trending, delta change, or absolute threshold methods previously described indicate that there is a significant difference in any of the 2×LF peaks and/or the sum of a subset of peaks. Since any stator fault will in some way effect changes in the slot pass family of peaks, these methods need only be applied to the slot pass family of peaks. It should be noted that for purposes of this Example, no prior measurements were available to perform a statistical trending analysis, so significant changes are illustrated by way of delta thresholds only.

Figure 4:
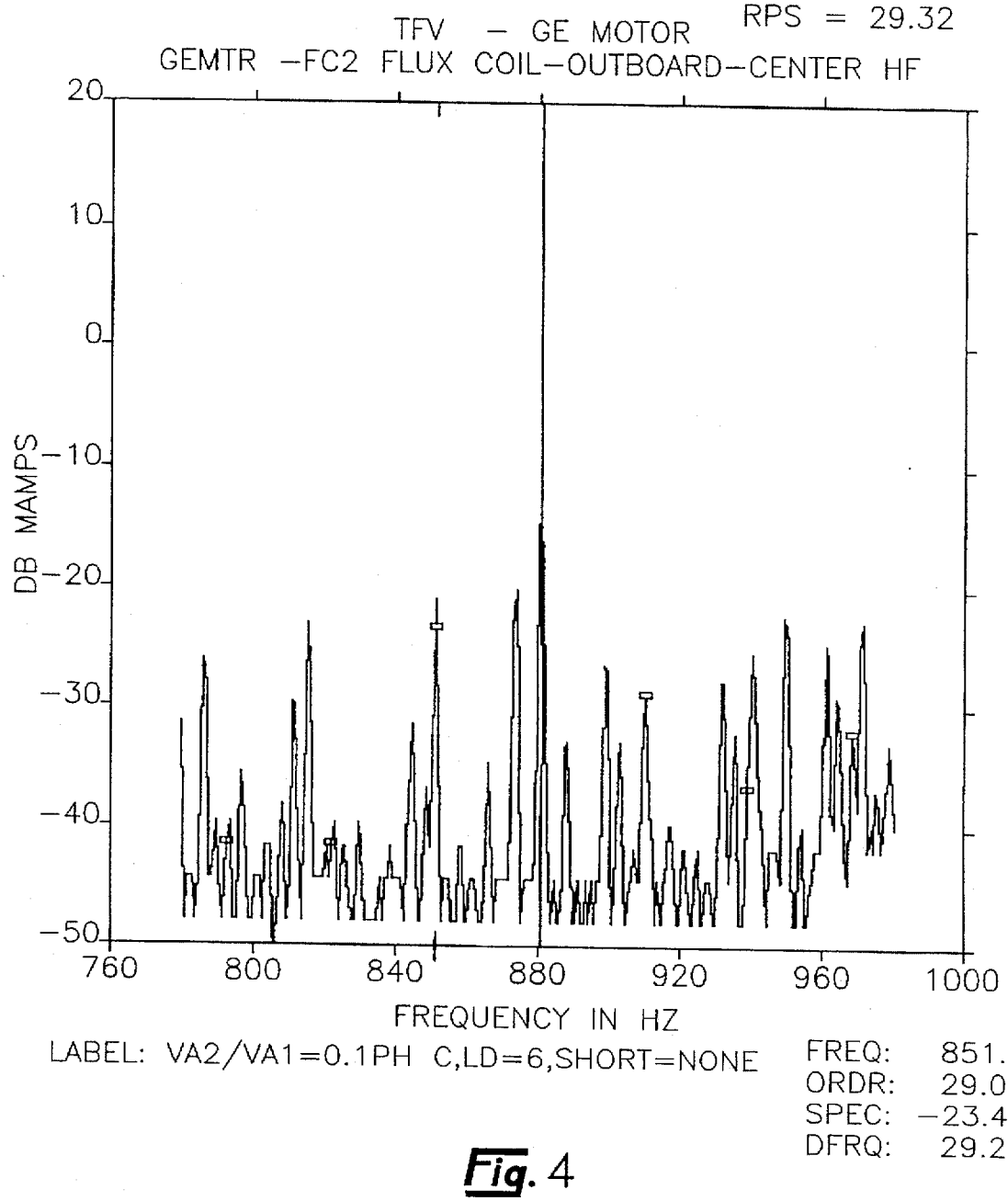
FIG. 4 is a leakage flux spectrum plot showing running speed harmonic sidebands modulating about the principle slot pass frequency ($PSP_r$) plus two times line frequency (2×LF) of an electric induction motor in good condition.
Figure 5:
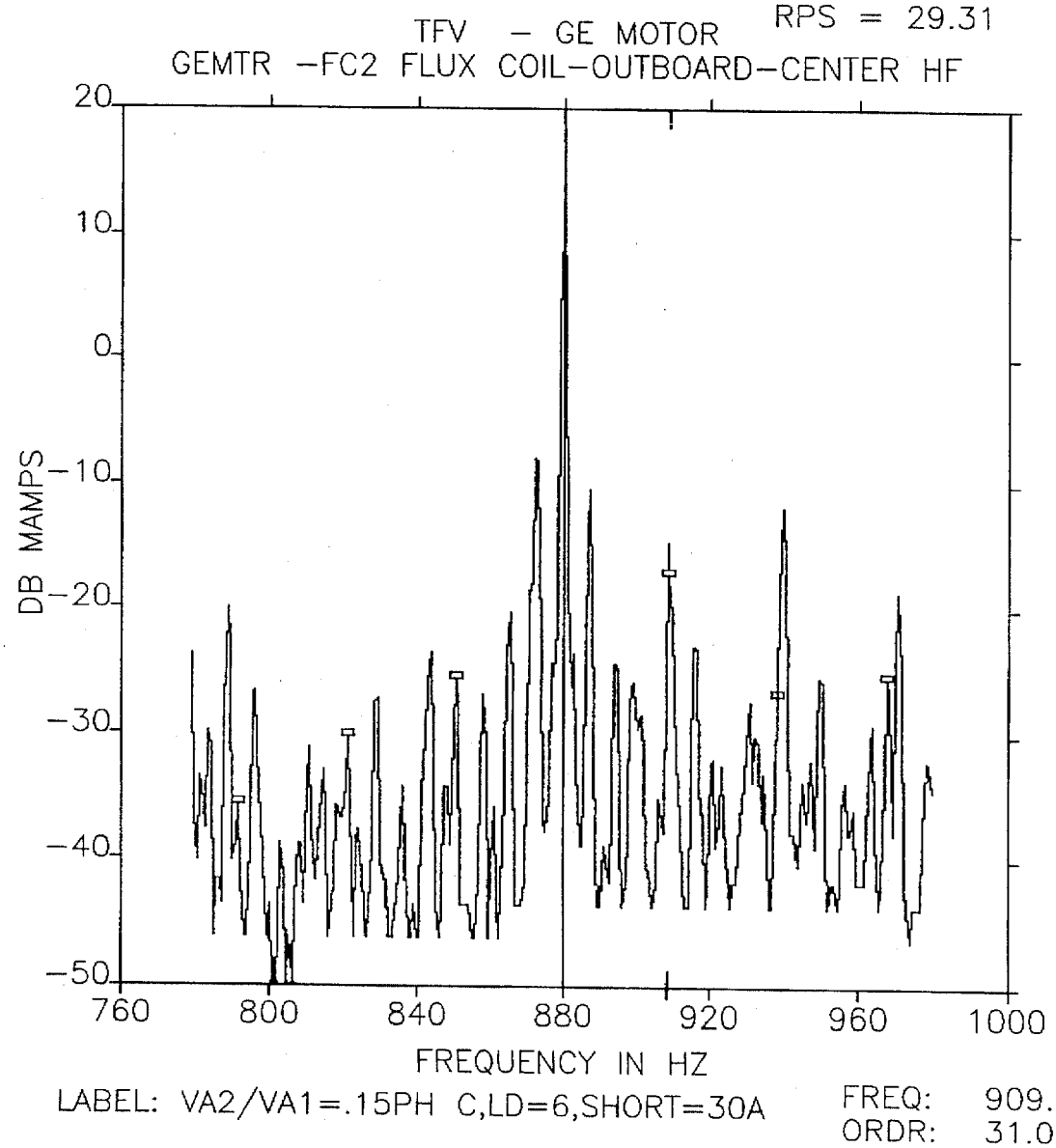
FIG. 5 is a leakage flux spectrum plot showing running speed harmonic sidebands modulating about the $PSP_r$+2×LF peak of an electric induction motor having a stator fault.
Figure 6:
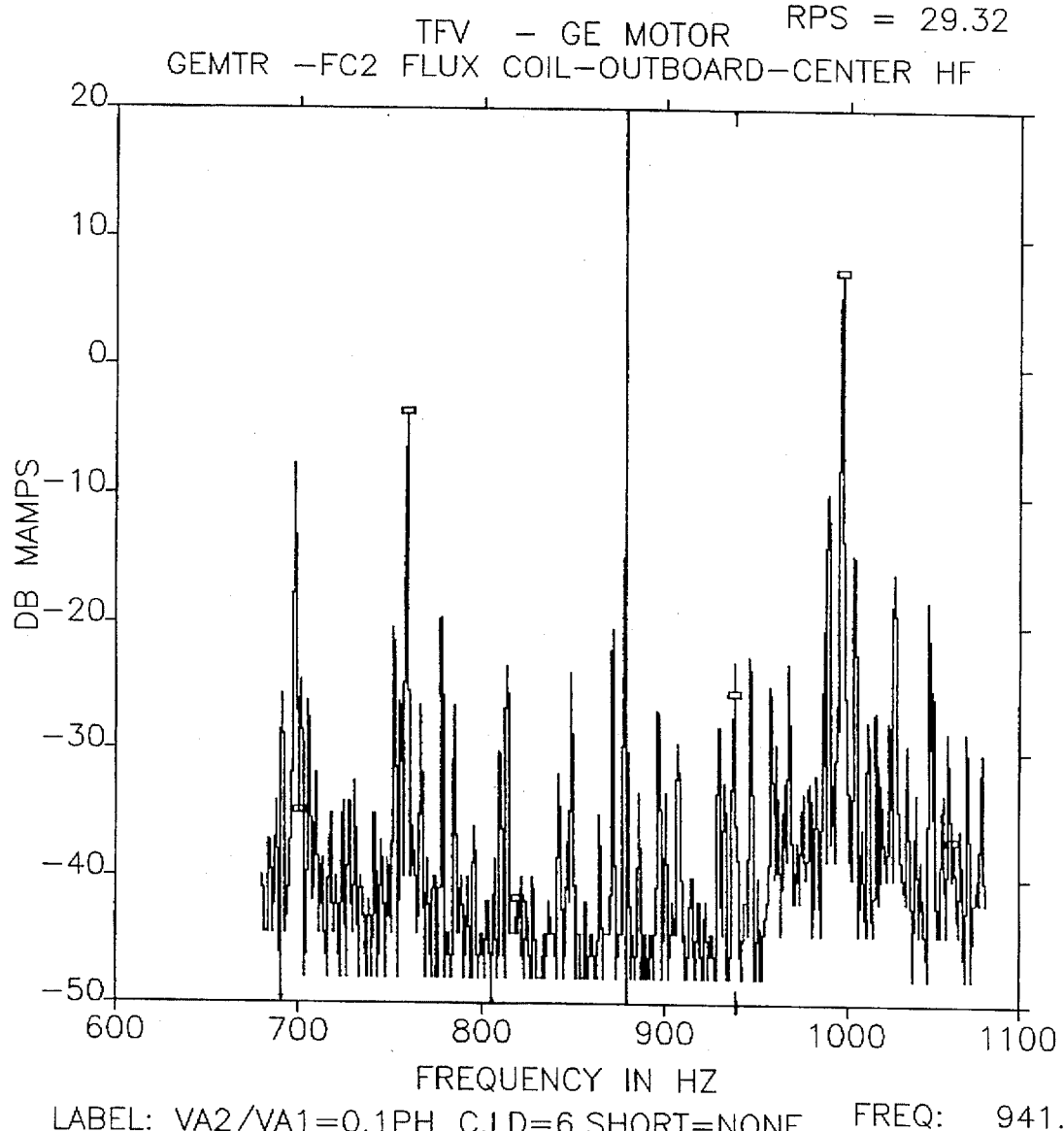
FIG. 6 is a leakage flux spectrum plot showing line frequency sidebands of the $PSP_r$+2×LF peak for an electric induction motor in good condition.
Figure 7:
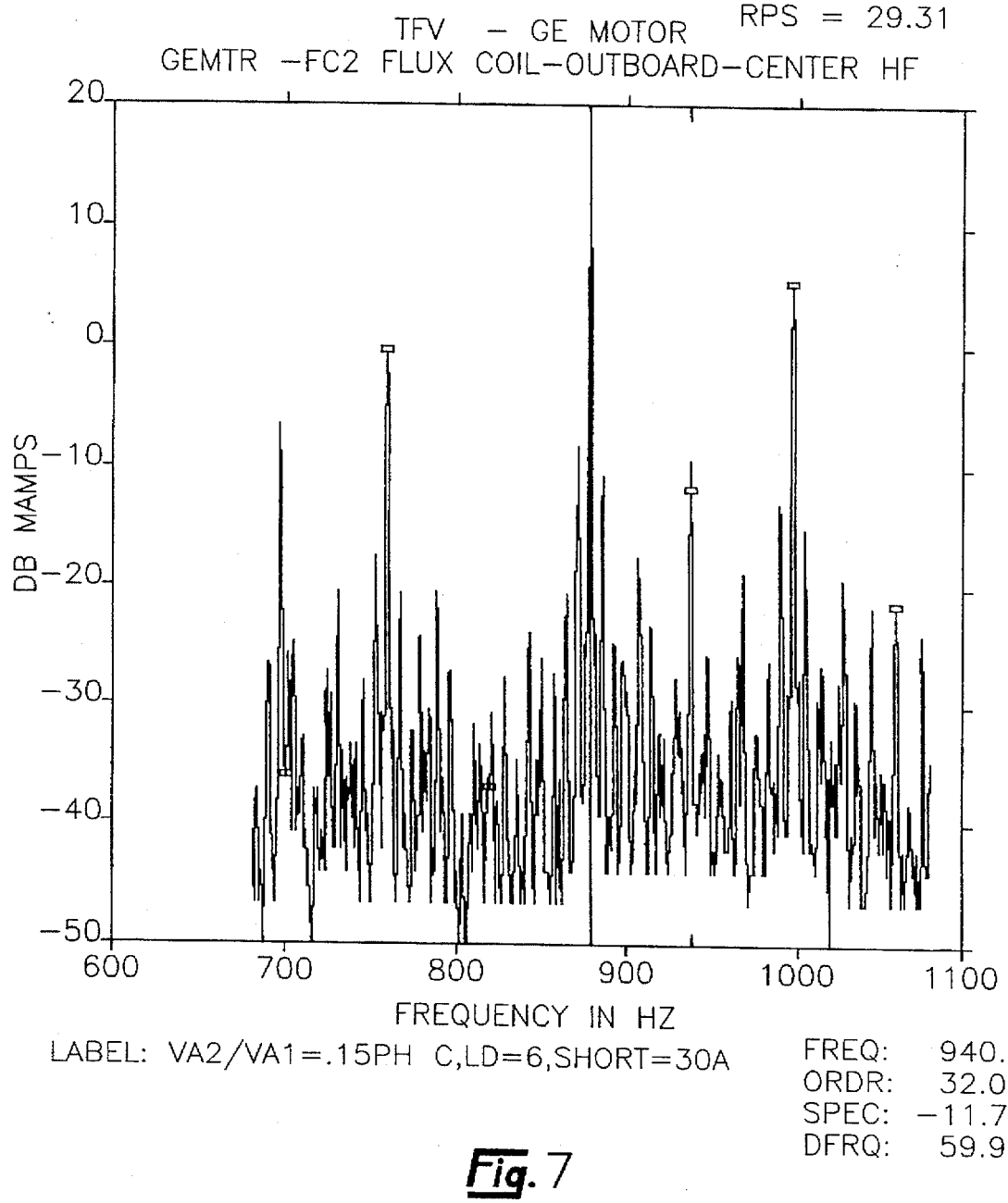
FIG. 7 is a leakage flux spectrum plot showing line frequency sidebands of the $PSP_r$+2×LF peak for an electric induction motor having a stator fault.
Figure 8:
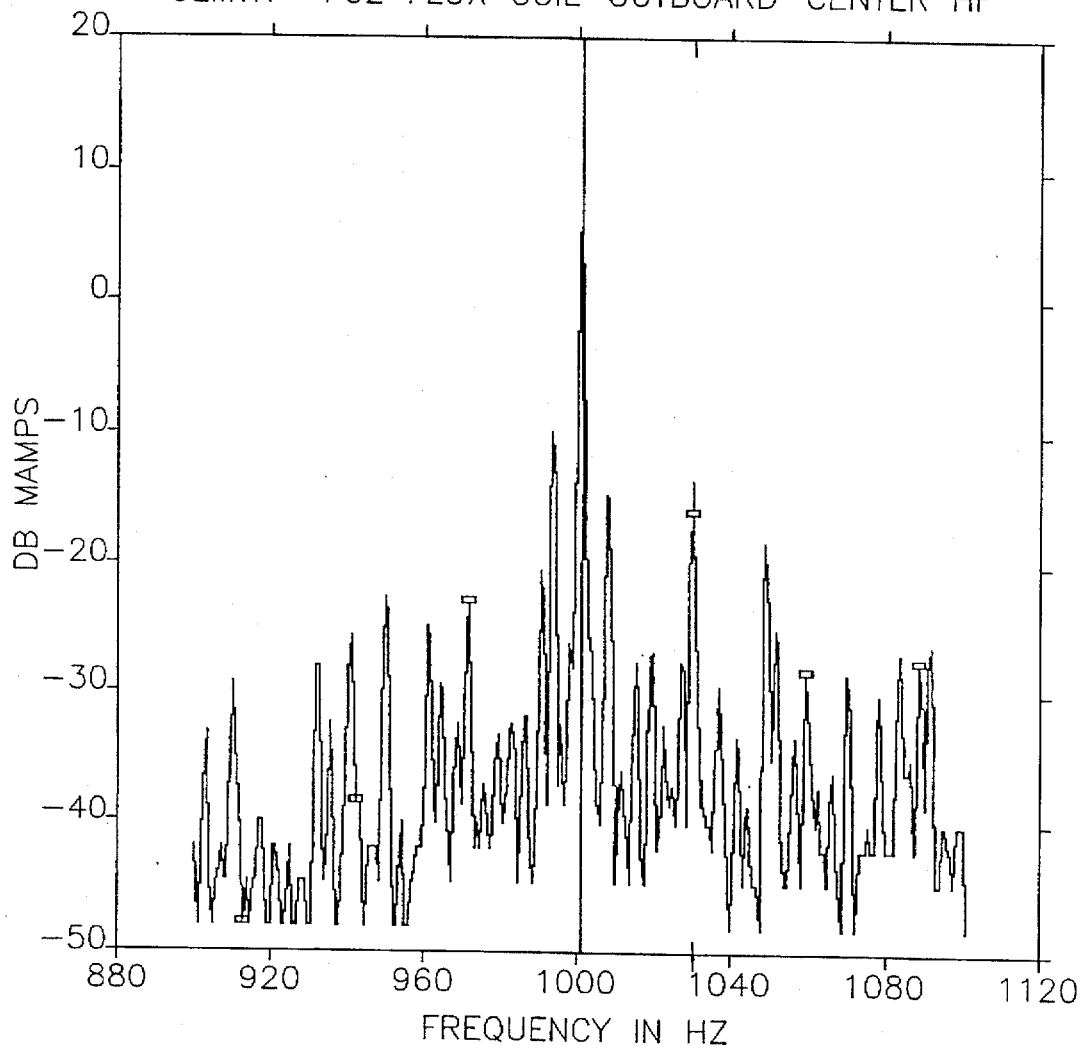
FIG. 8 is a leakage flux spectrum plot showing running speed sidebands modulating about the $PSP_r$30 4×LF peak of an electric induction motor in good condition.
Figure 9:
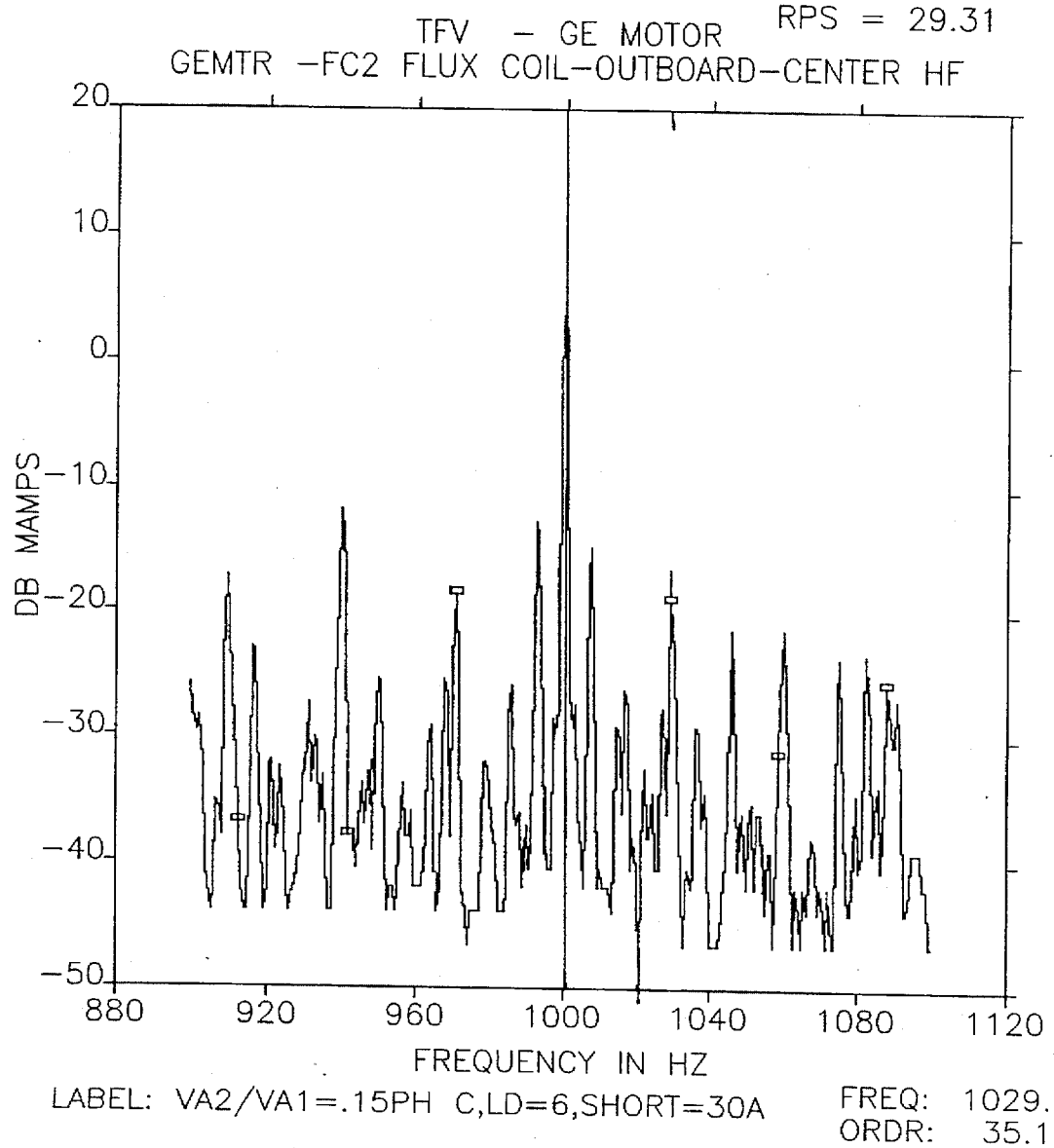
FIG. 9 is a leakage flux spectrum plot showing running speed sidebands modulating about the $PSP_r$+4×LF peak of an electric induction motor having a stator fault.

The area around $PSP_r+2LF$ for the motor in good condition (FIG. 2) was expanded and plotted in FIG. 4 to reveal the various sideband families. Specifically, RPS sidebands are marked. As previously discussed, these sideband families include multiples of running speed sidebands, slip frequency sidebands, and line frequency sidebands. Running speed sideband families modulating about $PSP_r+2LF$ for the motor in faulted condition are plotted in FIG. 5. FIGS. 6 and 7 show sidebands of the $PSP_r+2LF$ frequency occurring at line frequency for the good and faulted conditions respectively. The running speed sideband family modulating about the $PSP_r+4LF$ peak with the motor in good condition is plotted in FIG. 8, while a similar plot is shown in FIG. 9 for the motor in the faulted condition.

TABLE 1

Amplitudes of the Two times Line Frequency Family of Slot Pass Frequencies for a Motor in a Good and Faulted Condition

| Condition | Principle Slot Pass and multiples of 2 × LF sidebands (dB) | | | | | | Sum of Table 1 Peaks |
|---|---|---|---|---|---|---|---|
| | $PSP_r -$ $2 \times LF$ | $PSP_r$ | $PSP_r +$ $2 \times LF$ | $PSP_r +$ $4 \times LF$ | $PSP_r +$ $6 \times LF$ | $PSP_r +$ $8 \times LF$ | |
| Faulted @ 83% load | −22.04 | −0.31 | 10.38 | 5.27 | −7.29 | −17.05 | −31.04 |
| Good @ 83% load | −14.76 | −3.85 | −12.53 | 7.31 | −1.70 | −23.99 | −49.52 |
| Difference | −7.27 | 3.54 | 22.92 | −2.05 | −5.59 | 6.94 | 18.48 |

$PSP_r$ = Principle Slot Pass frequency as calculated using number of rotor bars ((#rotor bars × RPS) − LF)
LF = line frequency (Hz)

Listed in Table 2 are the amplitudes for a subset of the various slot pass family of sideband frequencies shown plotted in FIGS. 4 through 9. As Table 2 illustrates, a stator fault can also produce changes in running speed and line frequency sidebands modulating about the 2×LF family of peaks.

TABLE 2

Amplitudes for Some of the Running Speed and Line Frequency Sidebands Associated with the Slot Pass Family of Peaks for a Motor in a Good and Faulted Condition

| Condition | Various Slot Pass Family Sideband Frequencies (dB) | | | | | Sum of Table 2 RPS Related Peaks |
|---|---|---|---|---|---|---|
| | $PSP_r + 2LF - RPS$ | $PSP_r + 2LF + RPS$ | $(PSP_r + 2LF) + LF$ | $(PSP_r + 4 \times LF) - RPS$ | $(PSP_r + 4 \times LF) + RPS$ | |
| Faulted @ 83% load | −25.09 | −16.92 | −11.71 | −18.47 | −18.84 | −79.30 |
| Good @ 83% load | −23.48 | −29.07 | −25.16 | −22.35 | −15.86 | −90.76 |
| Difference | −1.61 | 12.15 | 13.45 | 3.88 | −2.98 | 11.46 |

$PSP_r$ = Principle Slot Pass frequency as calculated using number of rotor bars ((#rotor bars × RPS) − LF)
LF = line frequency (Hz)

Referring again to Table 1, it should be noted that the difference associated with $PSP_r+2LF$ (22.92 db) changed more, in an absolute sense, than any of the other 2×LF family of peaks. Also, the sum of the differences produced by the 2×LF family of peaks with the motor in the faulted condition was 18.48 db. The significance of these difference values will determine whether a fault exists. If the difference is significant, a fault exists; if insignificant, no fault exists.

Of course, not all changes occurring in the slot pass family of peaks will be significant. Most insignificant changes will occur as a result of changes in loading of the motor. To ascertain which, if any, of the difference values shown in Table 1 were significant, flux measurements were taken with the same motor running in good condition at different loads. Comparing changes that occur in the slot pass family of peaks as a result of different loading provides a delta threshold for insignificant changes. Changes in amplitudes that are below the delta threshold are insignificant, while changes in amplitudes that are greater than the delta threshold are significant and indicative of a fault.

In Table 3, the measured amplitudes for a subset of the 2×LF family of peaks with the motor in good condition running at 71% load are compared to the same motor at 83% load, and in Table 4, the amplitudes for a subset of the various slot pass family of sideband frequencies with the motor in good condition running at 71% load are compared to the same motor at 83% load. These test results are compared in Tables 3 and 4 to those with the motor running at 83% load to determine the delta threshold for this motor. Delta thresholds can be derived from the differences listed in Tables 3 and 4. Alternatively, a comparison of Tables 1 and 2 with Tables 3 and 4 yields significant changes in the $PSP_r+2LF$, $(PSP_r+2LF)+RPS$, and $(PSP_r+2LF)+LF$ peaks when a 10 dB absolute threshold is used as previously described.

TABLE 3

Amplitudes of the Two times Line Frequency Family of Slot Pass Frequencies for a Motor in a Good Condition Running at 71 and 83 Percent Load

| Condition | Principle Slot Pass and multiples of 2 × LF sidebands (dB) | | | | | | Sum of Table 3 Peaks |
|---|---|---|---|---|---|---|---|
| | $PSP_r - 2 \times LF$ | $PSP_r$ | $PSP_r + 2LF$ | $PSP_r + 4 \times LF$ | $PSP_r + 6 \times LF$ | $PSP_r + 8 \times LF$ | |
| Good @ 71% load | −19.36 | −6.38 | −15.47 | 5.07 | −3.84 | −25.71 | −65.69 |
| Good @ 83% load | −14.76 | −3.85 | −12.53 | 7.31 | −1.70 | −23.99 | −49.52 |
| Difference | −4.60 | −2.53 | −2.94 | −2.26 | −2.14 | −1.72 | −16.17 |

$PSP_r$ = Principle Slot Pass frequency as calculated using number of rotor bars ((#rotor bars × RPS) − LF)
LF = line frequency (Hz)

TABLE 4

Amplitudes for Some of the Running Speed and Line Frequency Sidebands Associated with the Slot Pass Family of Peaks for a Motor in a Good Condition Running at 71 and 83 Percent Load

| Condition | Various Slot Pass Family Sideband Frequencies (dB) | | | | | Sum of Table 4 RPS Related Peaks |
|---|---|---|---|---|---|---|
| | $PSP_r$ + 2LF − RPS | $PSP_r$ + 2LF + RPS | $(PSP_r$ + 2LF) + LF | $(PSP_r$ + 4 × LF) − RPS | $(PSP_r$ + 4 × LF) + RPS | |
| Good @ 71% load | −23.59 | −30.55 | −26.26 | −24.37 | −17.18 | −95.69 |
| Good @ 83% load | −23.48 | −29.07 | −25.16 | −22.35 | −15.86 | −90.76 |
| Difference | −0.11 | −1.48 | −1.10 | −2.02 | −1.32 | −4.93 |

$PSP_r$ = Principle Slot Pass frequency as calculated using number of rotor bars ((#rotor bars × RPS) − LF)
LF = line frequency (Hz)

It should be noted that in Table 3 no individual frequency changed by more than 4.60 dB and that the difference in the sum of the peaks produced was 16.17 dB. With these two values providing a delta threshold for insignificant changes, it is easy to see that most of the changes listed in Table 1 are significant in an absolute sense, and can also be trended to determine when a fault has occurred. Similarly, when Table 2 is contrasted with Table 4, significant changes can be seen to exist in the Table 2 $(PSP_r+2LF)+RPS$ and $(PSP_r+2LF)+LF$ peaks. Significant changes are also apparent in the sum of the running speed sideband amplitudes of Table 2. As previously described, these amplitudes, shown in Table 2, being members of the slot pass family of peaks, can also be used to determine when a fault occurs.

While certain members (subset of peaks) within the slot pass family of peaks (i.e., $PSP_r+2LF$, $(PSP_r+2LF)+RPS$, and $(PSP_r+LF)+LF$) increased significantly due to the turn-to-turn short induced in the stator of the test motor, the same kind of fault in another motor may be reflected in a different subset of peaks from within the slot pass family of peaks. However, it will be understood that for leakage flux measurements, at least one member of the slot pass family of peaks and/or the sum of a subset of this family will change significantly due to a turn-to-turn short or other asymmetry-producing fault. Since any member of the slot pass family of peaks is potentially capable of indicating an asymmetry-producing stator fault, it is not necessary that one know the exact number of rotor bars or stator slots, since the slot pass family is easily discernable in the flux spectrum.

Significant changes were also observed based on changes in the difference between line frequency amplitude and the amplitudes of various peaks within the slot pass family. This process is the definition of normalizing the data to line frequency. Tables 5 and 6 illustrate the changes in the difference between the line frequency amplitude and each individual peak amplitude for good and faulted conditions at 83% load, where line frequency of the faulted motor was 28.35 dB and the line frequency amplitude of the motor in good condition was 30.45 dB.

TABLE 5

Amplitude Differences Between the Two times Line Frequency Family of Slot Pass Frequencies And Line Frequency for a Motor in a Good and Faulted Condition

| Condition | Amplitude Difference between the 2 × LF Family of Slot Pass Frequencies And Line Frequency (dB)* | | | | | | Sum of Table 5 Peaks |
|---|---|---|---|---|---|---|---|
| | $PSP_r$ − 2 × LF | $PSP_r$ | $PSP_r$ + 2 × LF | $PSP_r$ + 4 × LF | $PSP_r$ + 6 × LF | $PSP_r$ + 8 × LF | |
| Faulted @ 83% load | 50.39 | 28.66 | 17.97 | 23.09 | 35.64 | 45.40 | 201.15 |
| Good @ 83% load | 45.21 | 34.29 | 42.98 | 23.14 | 32.14 | 54.44 | 232.20 |
| Difference | 5.18 | −5.63 | −25.01 | −0.05 | 3.50 | −9.03 | −31.05 |

$PSP_r$ = Principle Slot Pass frequency as calculated using number of rotor bars ((#rotor bars × RPS) − LF)
LF = line frequency (Hz)
*The basic calculation is LF amplitude minus amplitude of the peak of interest
Line frequency amplitude of faulted motor = 28.35 dB
Line frequency amplitude of good motor running at 83% load = 30.45 dB

TABLE 6

Amplitude Differences between Some of the Running Speed and Line Frequency Sidebands Associated with the Slot Pass Family of Peaks And Line Frequency for a Motor in a Good and Faulted Condition

| Condition | Amplitude Difference between Various Slot Pass Family Sideband Frequencies And Line Frequency (dB)* | | | | | Sum of Table 6 RPS Related Peaks |
|---|---|---|---|---|---|---|
| | $(PSP_r + 2LF) - RPS$ | $(PSP_r + 2LF) + RPS$ | $(PSP_r + 2LF) + LF$ | $(PSP_r + 4 \times LF) - RPS$ | $(PSP_r + 4 \times LF) + RPS$ | |
| Faulted @ 83% load | 53.45 | 45.27 | 40.10 | 46.82 | 47.19 | 192.73 |
| Good @ 83% load | 53.93 | 59.52 | 55.65 | 52.79 | 46.31 | 212.55 |
| Difference | −0.48 | −14.25 | −15.55 | −5.97 | 0.88 | −19.82 |

$PSP_r$ = Principle Slot Pass frequency as calculated using number of rotor bars ((#rotor bars × RPS) − LF)
LF = line frequency (Hz)
*The basic calculation is LF amplitude minus amplitude of the peak of interest
Line frequency amplitude of faulted motor = 28.35 dB
Line frequency amplitude of good motor running at 83% load = 30.45 dB To illustrate the Table 5 and 6 calculations, the faulted motor amplitude difference between line frequency of the faulted motor and the $PSP_r - 2 \times LF$ amplitude of 50.39 dB shown in Table 5 was arrived at by subtracting the faulted motor $PSP_r - 2 \times LF$ amplitude shown in Table 1 (−22.04 dB) from the faulted motor line frequency amplitude (28.35 dB). Likewise, the good motor amplitude difference between line frequency of the good motor and the $PSP_r - 2 \times LF$ amplitude of 45.21 dB was calculated by subtracting the $PSP_r - 2 \times LF$ amplitude of the motor in good condition as shown in Table 1 (−14.76 dB) from the line frequency amplitude with the motor in good condition (30.45 dB).

Tables 7 and 8 summarize the amplitude differences between the line frequency and individual peaks for the motor in good condition running at 71% and 83% load, where the line frequency amplitude of the good motor at 71% load was measured at 29.73 dB and the line frequency amplitude of the good motor at 83% load was 30.45 dB.

TABLE 7

Amplitude Differences between the Two times Line Frequency Family of Slot Pass Frequencies And Line Frequency for a Motor in a Good Condition Running at 71% and 83% Load

| Condition | Amplitude Difference between the 2 × LF Family of Slot Pass Frequencies And Line Frequency (dB)* | | | | | | Sum of Table 7 Peaks |
|---|---|---|---|---|---|---|---|
| | $PSP_r - 2 \times LF$ | $PSP_r$ | $PSP_r + 2 \times LF$ | $PSP_r + 4 \times LF$ | $PSP_r + 6 \times LF$ | $PSP_r + 8 \times LF$ | |
| Good @ 71% load | 49.10 | 36.12 | 45.21 | 24.67 | 33.58 | 55.45 | 244.13 |
| Good @ 83% load | 45.21 | 34.29 | 42.98 | 23.14 | 32.14 | 54.44 | 232.20 |
| Difference | 3.89 | 1.83 | 2.23 | 1.53 | 1.44 | 1.01 | 11.93 |

$PSP_r$ = Principle Slot Pass frequency as calculated using number of rotor bars ((#rotor bars × RPS) − LF)
LF = line frequency (Hz)
*The basic calculation is LF amplitude minus amplitude of the peak of interest
Line frequency amplitude of good motor running at 71% load = 29.73 dB
Line frequency amplitude of good motor running at 83% load = 30.45 dB

TABLE 8

Amplitude Differences between Some of the Running Speed and Line Frequency Sidebands Associated with the Slot Pass Family of Peaks And Line Frequency for a Motor in a Good Condition Running at 71 and 83 Percent Load

| Condition | Amplitude Difference between Various Slot Pass Family Sideband Frequencies And Line Frequency (dB)* | | | | | Sum of Table 8 RPS Related Peaks |
|---|---|---|---|---|---|---|
| | (PSP$_r$ + 2LF) − RPS | (PSP$_r$ + 2LF) + RPS | (PSP$_r$ + 2LF) + LF | (PSP$_r$ + 4 × LF) − RPS | (PSP$_r$ + 4 × LF) + RPS | |
| Good @ 71% load | 53.33 | 60.29 | 56.00 | 54.11 | 46.92 | 214.65 |
| Good @ 83% load | 53.93 | 59.52 | 55.65 | 52.79 | 46.31 | 212.55 |
| Difference | −0.60 | 0.77 | 0.35 | 1.32 | 0.61 | 2.10 |

PSP$_r$ = Principle Slot Pass frequency as calculated using number of rotor bars ((#rotor bars × RPS) − LF)
LF = line frequency (Hz)
*The basic calculation is LF amplitude minus amplitude of the peak of interest
Line frequency amplitude of good motor running at 71% load = 29.73 dB
Line frequency amplitude of good motor running at 83% load = 30.45 dB The significance of these changes is readily determined by comparing the values of Tables 5 and 6 to those at Tables 7 and 8. By setting a delta threshold value of 10 dB per peak as previously described, it can be seen from Tables 5 and 6 that the PSP$_r$+2LF, (PSP$_r$+2LF)+RPS, and (PSP$_r$+2LF)+LF amplitudes changed significantly because of the stator winding fault, as did the sum of the 2×LF family and the sum of the running speed sideband subset.

Members of the slot pass family of frequencies were identified from the 2×LF family of sidebands and running speed (RPS) sidebands, most of which are listed in the table of FIG. 10. Also shown in FIG. 10 under the heading Comparison Amplitude are the measured flux spectra amplitudes for frequencies within the slot pass family, and under the heading Reference Amplitude are previously measured spectra amplitudes. Alternatively, the Comparison and Reference amplitudes may be normalized to the line frequency amplitude to reduce the potential effects on the data and analysis resulting from load changes. If one or more of the comparison amplitudes are significantly different than corresponding reference amplitudes, or if subsets of the comparison amplitudes have changed significantly, then a fault condition is likely.

FIG. 10 tabulates for each slot pass frequency a Reference Amplitude (dB) and the measured Comparison Amplitude (dB). Differences between individual ones of the comparison and reference amplitudes are calculated by two methods. First, a difference is calculated by subtracting the reference from the comparison. This calculation yields a difference value measured in dB units. Second, a difference is calculated and expressed as a simple ratio of the RMS value of comparison amplitudes to the RMS value of corresponding reference amplitudes, which is always greater than zero. Where a comparison spectrum amplitude differs from a corresponding reference spectrum amplitude by more than a threshold amount (percentage difference (delta) or absolute amplitude difference), a stator fault or other electrical anomaly is known to exist.

In one analysis, a delta value of + or − 10 dB was compared to each of the difference amplitudes shown in the Difference (Comp-Ref)(dB) column. As the data in FIG. 10 illustrates, difference values for five members of the slot pass family exceeded the threshold. The five frequencies of the slot pass family which exceeded the threshold are at 520.8 Hz, 731.3 Hz, 789.9 Hz, 880.6 Hz, and 909.9 Hz. From this information, a fault condition is known to exist.

The existence of a fault was also determined from other parameters in FIG. 10 by comparison to an absolute parameter value. Any RMS ratios greater than 3.16 or less than 0.316 are considered significant and possibly indicative of a fault. A comparison of the calculated RMS ratios to an absolute threshold RMS value of 3.16 revealed that the same five slot pass family members identified above had realized significant changes in amplitudes, indicating the likely presence of a fault.

At the bottom of FIG. 10, additional analysis of the comparison and reference data is displayed for the entire slot pass family, grouped in several ways. The slot pass family of frequencies is grouped under the heading Slot Pass Family in two ways—2×LF sidebands and running speed (RPS) sidebands. Four separate parameters calculated from four separate subsets of slot pass frequencies are tabulated for each of the sideband groupings (total of eight parameters as further described below). Significant changes in any of the eight parameters (determined by threshold variation from reference values as either an absolute threshold variation, percentage (or delta) threshold variation, or statistical threshold variation) are indicative of a fault.

Under the Comparison-Reference + Energy heading are numbers (measured in RMS units) calculated from a subset of slot pass family members that includes members whose comparison amplitude is larger than the corresponding reference amplitude. Within the 2×LF sidebands, these members are at 520.8 Hz, 760.6 Hz, 880.6 Hz, 1240.4 Hz, and 1360.3 Hz. The + Energy members of the RPS sideband group are at 731.3 Hz, 789.9 Hz, 909.9 Hz, and 971.2 Hz. The difference in amplitude of each such member is squared, then summed, and the square root of the sum is displayed.

Parameters may be normalized for analysis. In the Normalized Comp-Ref Positive and Negative columns, normalized values (in RMS units) of the + Energy and − Energy parameters were calculated from the ratio of numbers displayed in the Comparison-Reference + Energy and − Energy columns to the number (2.60) shown at the bottom of FIG. 10 in the Ref. Slot Pass Energy Sum field. The Ref. Slot Pass Energy Sum is an RMS value calculated by adding the squared amplitude of each identified slot pass family member in the reference spectrum, and taking the square root of the sum.

Amplitudes associated with individual frequencies and groups of frequencies shown in FIG. 10 can also be statistically compared to trend data for the motor to determine if a fault exists. For example, if the comparison data differs from the trend data for the motor by three standard deviations from the mean, a fault is known to exist. FIGS. 11–14 vividly illustrate how trending can be used to identify the presence of a stator fault.

Figure 11:
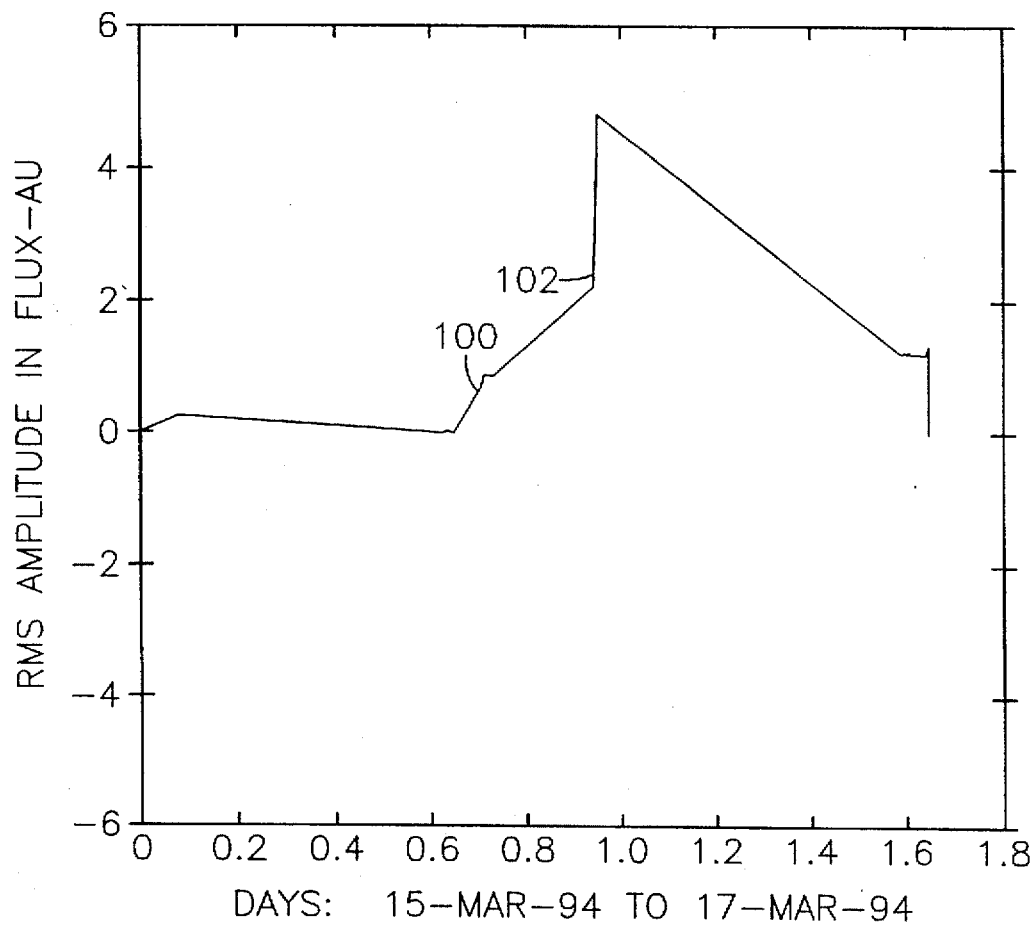
FIG. 11 is a trend plot of a 2×LF parameter as measured over a 1.6 day period, during which time motor faults were induced.

FIG. 11 is trend plot of the Normalized Comp-Ref Positive parameter for the 2×LF family (shown in FIG. 10) as measured over a 1.6 day period, and FIG. 12 is a chronological listing of individual parameter measurements that were used to create the plot shown in FIG. 11. During the period between 0.0–0.6 days, experimental voltage phase imbalance was induced in the motor. At the point generally indicated at 100 (Mar. 16, 1994 at 10:48 entry in FIG. 12), voltage imbalance was induced with a significant (greater than three standard deviations from the mean) increase in amplitude. At the 0.6 day point (indicated generally in FIG. 11 at 102 and shown in FIG. 12 as the Mar. 16, 1994 at 15:49 entry), a winding to winding short was induced, as can be easily seen by the significant increase in RMS amplitude. The severity of the short was effected by varying supply voltage balance and gradually changing the severity of the short until at about day 1.6, all faults were removed and RMS amplitude returned to normal.

Figure 13:
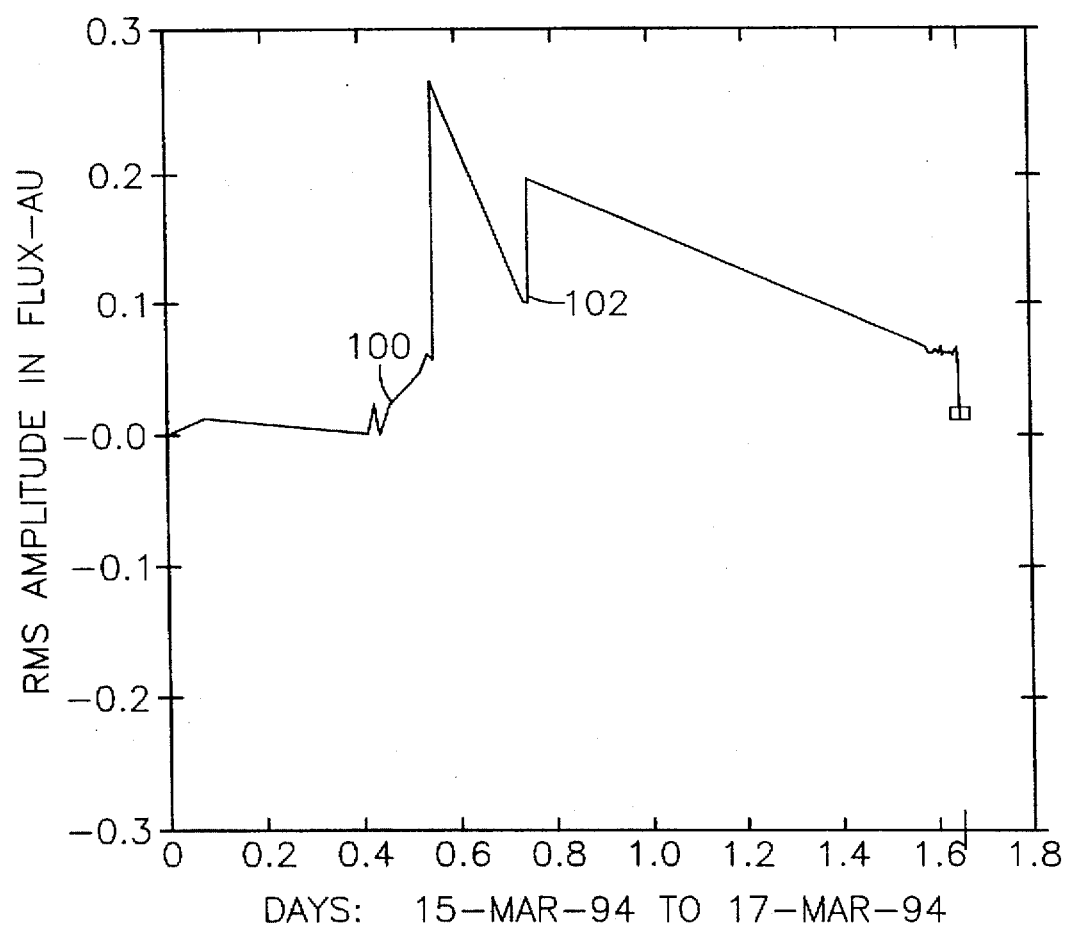
FIG. 13 is a trend plot of a running speed parameter as measured over a 1.6 day period, during which time motor faults were induced.

A similar plot of trended measurements of the Normalized Comp-Ref Positive parameter for RPS sidebands is shown in FIG. 13. Individual measurements for the plot of FIG. 13 are listed in FIG. 14. Significant increases in RMS amplitude occurring at points 100 and 102 are easily identified as indicative of the presence of an anomalous condition.

While much of the foregoing discussion of preferred embodiments focuses on detection of stator faults occurring in an AC induction motor, it will be understood that these methods can also be used to detect electrically related faults occurring in other types of electric machines, including synchronous motors, DC motors, and electric generators.

It is contemplated, and will be apparent to those skilled in the art from the foregoing specification, drawings, and example that modifications and/or changes may be made in the embodiments of the invention. Accordingly, it is expressly intended that the foregoing description and example are illustrative of preferred embodiments only, not limiting thereto, and that the true spirit and scope of the present invention be determined by reference to the appended claims.

What is claimed is:

1. A method of detecting electrical anomalies in an electric machine having a stator and a rotor, said machine producing magnetic leakage flux during operation, the method comprising the steps of:

producing a comparison time series of flux signals, containing slot pass family frequency components and associated amplitude components, with a flux measurement sensor, said comparison flux signals being representative of the leakage flux of the machine;

transforming said time series of comparison flux signals to a comparison spectrum representative of the slot pass family frequency components and associated amplitude components of the comparison flux signals;

providing one or more prior spectra representative of the slot pass family frequencies and related amplitude components of leakage flux produced by said electric machine when no electrical anomalies exist;

determining one or more comparison parameters from the comparison spectrum;

determining one or more prior parameters for each of said one or more prior spectra corresponding to said one or more comparison parameters;

comparing said one or more comparison parameters to said one or more prior parameters of at least one prior spectrum; and determining the presence of an electrical anomaly when at least one comparison parameter differs from one or more corresponding prior parameters by a threshold amount.

2. The method of claim 1 wherein:

at least one of said one or more prior parameters is determined by determining the amplitude of a single slot pass family frequency of a prior spectrum; and at least one of said one or more comparison parameters is determined by determining the amplitude of a single slot pass family frequency of said comparison spectrum.

3. The method of claim 1:

wherein at least one of said one or more prior parameters is determined by mathematically combining each amplitude within a subset of amplitudes of the slot pass family frequencies of a prior spectrum; and wherein at least one of said one or more comparison parameters is determined by mathematically combining a subset of amplitudes of the slot pass family frequencies of the comparison spectrum.

4. The method of claim 1 wherein:

said step of determining one or more prior parameters includes the steps of:

determining first difference values representing the difference between a corresponding group of amplitudes within the slot pass family frequencies of a first prior spectrum and a second prior spectrum, said first difference values including first + energy values representing difference values for amplitudes of the second prior spectrum that are greater than corresponding amplitudes of the first prior spectrum and first − energy values representing difference values for amplitudes of the second prior spectrum that are less than corresponding amplitudes of the first prior spectrum;

squaring first + energy values to produce squared first + energy values;

summing said squared first + energy values to produce a first + energy sum; and determining the square root of the first + energy sum to produce a first prior parameter;

said step of determining one or more comparison parameters includes the steps of:

determining comparison difference values representing the difference between a corresponding group of amplitudes within the slot pass family frequencies of the comparison and first prior spectra, said comparison difference values including comparison + energy values representing difference values for amplitudes of the comparison spectrum that are greater than corresponding amplitudes of the first prior spectrum and comparison − energy values representing difference values for amplitudes of the comparison spectrum that are less than corresponding amplitudes of the first prior spectrum;

squaring comparison + energy values to produce squared comparison + energy values;

summing said squared comparison + energy values to produce a comparison + energy sum; and determining the square root of the comparison + energy sum to produce a comparison parameter.

5. The method of claim 4 wherein said group of amplitudes includes amplitudes of the 2×LF family of frequencies.

6. The method of claim 4 wherein said group of amplitudes includes amplitudes of the RPS sideband family of frequencies.

7. The method of claim 4, further comprising the step of normalizing each of said first prior and comparison parameters.

8. The method of claim 7 wherein said normalizing step includes the steps of:

squaring amplitudes of the first prior spectrum to produce squared first amplitudes;

summing said squared first amplitudes to produce a squared first amplitude sum;

determining the square root of the squared first amplitude sum, producing a first normalization value; and dividing said first prior and comparison parameters by said first normalization value.

9. The method of claim 4 wherein said step of determining one or more prior parameters further includes:

determining second difference values representing the difference between a corresponding group of amplitudes within the slot pass family frequencies of a third prior spectrum and the first prior spectrum, said second difference values including second + energy values representing difference values for amplitudes of the third prior spectrum that are greater than corresponding amplitudes of the first prior spectrum and second − energy values representing difference values for amplitudes of the third prior spectrum that are less than corresponding amplitudes of the first prior spectrum;

squaring second + energy values to produce squared second + energy values;

summing said squared second + energy values to produce a second + energy sum; and determining the square root of the second + energy sum to produce a second prior parameter;

wherein said first and second prior parameters collectively comprise trend data.

10. The method of claim 9 wherein said group of amplitudes includes amplitudes of the 2×LF family of frequencies.

11. The method of claim 9 wherein said group of amplitudes includes amplitudes of the RPS sideband family of frequencies.

12. The method of claim 9, further comprising the step of normalizing each of said first prior, second prior, and comparison parameters.

13. The method of claim 12 wherein said normalizing step includes the steps of:

squaring amplitudes of the first prior spectrum to produce squared first amplitudes;

summing said squared first amplitudes to produce a squared first amplitude sum;

determining the square root of the squared first amplitude sum, producing a first normalization value; and dividing said first prior, second prior, and comparison parameters by said first normalization value.

14. The method of claim 1 wherein:

said step of determining one or more prior parameters includes the steps of:

determining first difference values representing the difference between a corresponding group of amplitudes within the slot pass family frequencies of a first prior spectrum and a second prior spectrum, said first difference values including first + energy values representing difference values for amplitudes of the second prior spectrum that are greater than corresponding amplitudes of the first prior spectrum and first − energy values representing difference values for amplitudes of the second prior spectrum that are less than corresponding amplitudes of the first prior spectrum;

squaring first − energy values to produce squared first − energy values;

summing said squared first − energy values to produce a first − energy sum; and determining the square root of the first − energy sum to produce a first prior parameter;

said step of determining one or more comparison parameters includes the steps of:

determining comparison difference values representing the difference between a corresponding group of amplitudes within the slot pass family frequencies of the comparison and first prior spectra, said comparison difference values including comparison + energy values representing difference values for amplitudes of the comparison spectrum that are greater than corresponding amplitudes of the first prior spectrum and comparison − energy values representing difference values for amplitudes of the comparison spectrum that are less than corresponding amplitudes of the first prior spectrum;

squaring comparison − energy values to produce squared comparison − energy values;

summing said squared comparison − energy values to produce a comparison − energy sum; and determining the square root of the comparison − energy sum to produce a comparison parameter.

15. The method of claim 14 wherein said group of amplitudes includes amplitudes of the 2×LF family of frequencies.

16. The method of claim 14 wherein said group of amplitudes includes amplitudes of the RPS sideband family of frequencies.

17. The method of claim 14, further comprising the step of normalizing each of said first prior and comparison parameters.

18. The method of claim 17 wherein said normalizing step includes the steps of:

squaring amplitudes of the first prior spectrum to produce squared first amplitudes;

summing said squared first amplitudes to produce a squared first amplitude sum;

determining the square root of the squared first amplitude sum, producing a first normalization value; and dividing said first prior and comparison parameters by said first normalization value.

19. The method of claim 14 wherein said step of determining one or more prior parameters further includes:

determining second difference values representing the difference between a corresponding group of amplitudes within the slot pass family frequencies of a third prior spectrum and the first prior spectrum, said second difference values including second + energy values representing difference values for amplitudes of the third prior spectrum that are greater than corresponding amplitudes of the first prior spectrum and second − energy values representing difference values for amplitudes of the third prior spectrum that are less than corresponding amplitudes of the first prior spectrum;

squaring second − energy values to produce squared second − energy values;

summing said squared second − energy values to produce a second − energy sum; and determining the square root of the second − energy sum to produce a second prior parameter.

20. The method of claim 19 wherein said group of amplitudes includes amplitudes of the 2×LF family of frequencies.

21. The method of claim 19 wherein said group of amplitudes includes amplitudes of the RPS sideband family of frequencies.

22. The method of claim 19, further comprising the step of normalizing each of said first prior, second prior, and comparison parameters.

23. The method of claim 22 wherein said normalizing step includes the steps of:

squaring amplitudes of the first prior spectrum to produce squared first amplitudes;

summing said squared first amplitudes to produce a squared first amplitude sum;

determining the square root of the squared first amplitude sum, producing a first normalization value; and dividing said first prior, second prior, and comparison parameters by said first normalization value.

24. The method of claim 1 wherein said threshold amount is any amount beyond an absolute parametric value.

25. The method of claim 1 wherein said threshold amount is a delta or percentage.

26. The method of claim 1 wherein said threshold amount is determined by calculating the mean value of at least two corresponding prior parameters from at least two prior spectra, wherein said threshold amount is three standard deviations from said mean value.

27. The method of claim 1, further comprising the step of normalizing each of said comparison and prior spectra to the amplitude of the machine's line frequency.

28. The method of claim 1 wherein said step of providing one or more prior spectra comprises the steps of:

generating a reference time series of flux signals with a flux measurement sensor at a reference time while the machine is operating in good condition, said reference time series of flux signals containing slot pass family frequencies and associated amplitudes representative of the leakage flux of the machine;

transforming said reference time series of flux signals into a reference spectrum and storing said reference spectrum, said reference spectrum representative of the slot pass family frequencies and associated amplitudes of the reference time series of flux signals;

generating a first time series of flux signals with a flux measurement sensor at a first time that is later than said reference time, said first time series of flux signals containing slot pass family frequencies and associated amplitudes representative of the leakage flux of the machine at said first time;

transforming said first time series of flux signals into a first spectrum representative of the slot pass family frequencies and associated amplitudes of the first time series of flux signals;

generating a second time series of flux signals with a flux measurement sensor at a second time that is later than said reference and first times, said second time series of flux signals containing slot pass family frequencies and associated amplitudes representative of the leakage flux of the machine at said second time;

transforming said second time series of flux signals into a second spectrum representative of the slot pass family frequencies and associated amplitudes of the second time series of flux signals;

said step of determining one or more prior parameters including the steps of:

calculating one or more first parameters from corresponding amplitudes of the first and reference spectra; and calculating one or more second parameters from corresponding amplitudes of the second and reference spectra;

said step of determining one or more comparison parameters including calculating one or more comparison parameters from corresponding amplitudes of the comparison and reference spectra.

29. The method of claim 28 wherein said flux measurement sensor is placed consistently at the same location and orientation on said machine for all time series of flux signals produced.

30. The method of claim 1 further comprising determining the slot pass family frequencies by:

determining a value $RPS_L$ representing the running speed of the machine under load;

determining a value RB representing the number of rotor bars present in the rotor;

determining a value LF representing the line frequency of the machine;

computing a value PSP representing the principle slot pass frequency of the machine where:

$$PSP = (RB \times RPS_L) - LF$$

computing a plurality of slot pass frequencies (SPFs) by the equation $$SPFs = PSP \pm n \times LF$$

where n=0, 2, 4, . . .

determining a value PP representing the number of pole pairs of the machine;

computing a value $RPS_s$ representing the synchronous speed of the machine under no load where $$RPS_s = LF/PP$$

computing a value SF representing the slip frequency of the machine under load where $$SF=RPS_s-RPS_L$$

wherein the slot pass family of frequencies comprises PSP, SPFs, and multiples of $RPS_L$, LF, and SF sidebands modulating about each of the $SPF_s$.

31. The method of claim 30 wherein said step of computing a value PSP further comprises computing PSP by the equation $$PSP=(SS \times RPS)-LF$$

where SS represents the number of stator slots.

32. The method of claim 1 wherein said threshold amount is determined by:
  generating a first time series of flux signals when the machine is operating at a first fraction of rated load, said first time series of flux signals being representative of the machine's leakage flux when operating at said first fraction of rated load;
  generating a second time series of flux signals when the machine is operating at a second fraction of rated load, said second time series of flux signals being representative of the machine's leakage flux when operating at said second fraction of rated load;
  transforming said first time series of flux signals into a first test spectrum representative of the slot pass family frequency components and associated amplitude components of the first time series of flux signals;
  transforming said second time series of flux signals into a second test spectrum representative of the slot pass family frequency components and associated amplitude components of the second time series of flux signals; and
  comparing parameters of the first test spectrum, at the slot pass family frequencies, to parameters of the second test spectrum, at the slot pass family frequencies, to determine parameter difference values, said difference values representing the threshold amount.

33. The method of claim 1 wherein said step of providing one or more prior spectra includes estimating a prior spectrum based on a knowledge of flux spectra typically produced by similar machines.

34. The method of claim 1 wherein said transforming step further comprises digitizing the time series of comparison flux signals to produce a digitized time series of comparison flux signals, and transforming the digitized time series of comparison flux signals to the frequency domain by means of a fast Fourier transform to produce the comparison spectrum.

35. The method of claim 1 wherein said step of providing one or more prior spectra comprises for each prior spectrum:
  producing a time series of no-fault flux signals, containing slot pass family frequency components and associated amplitude components, with a flux measurement sensor, during no-fault operation of the machine, said no-fault flux signals being representative of the leakage flux of the machine during said no-fault operation;
  digitizing the time series of no-fault flux signals to produce a digitized time series of no-fault flux signals; and
  transforming the digitized time series of no-fault flux signals to the frequency domain by means of a fast Fourier transform to produce a prior spectrum.

36. A method of detecting electrical anomalies in an electric machine having a stator and a rotor, said machine producing magnetic leakage flux during operation, the method comprising the steps of:
  producing a time series of flux signals, containing slot pass family frequency components and associated amplitude components, with a flux measurement sensor, said flux signals being representative of the leakage flux of the machine;
  transforming said time series of flux signals to a frequency spectrum representative of the slot pass family frequency components and associated amplitude components of the flux signals;
  determining one or more parameters from the frequency spectrum;
  comparing said one or more parameters to an absolute parametric value; and
  determining the presence of an electrical anomaly when at least one parameter exceeds the absolute parametric value.

37. A method of detecting electrical anomalies in an electric machine having a stator and a rotor, said machine producing magnetic leakage flux during operation, the method comprising the steps of:
  producing a comparison time series of flux signals, containing slot pass family frequency components and associated amplitude components, with a flux measurement sensor, said comparison flux signals being representative of the leakage flux of the machine;
  transforming said time series of comparison flux signals to a comparison spectrum representative of the slot pass family frequency components and associated amplitude components of the comparison flux signals;
  providing a reference spectrum representative of the slot pass family frequencies and related amplitude components of leakage flux produced by said electric machine when no electrical anomalies exist;
  mathematically combining at least one amplitude or subset of amplitudes of the comparison spectrum with at least one corresponding amplitude or subset of amplitudes of the reference spectrum to produce one or more parameters;
  comparing at least one parameter to an absolute parametric value; and
  determining the presence of an electrical anomaly when said at least one parameter exceeds the absolute parametric value.

* * * * *